(12) United States Patent
Koshihara et al.

(10) Patent No.: US 9,236,425 B2
(45) Date of Patent: Jan. 12, 2016

(54) LIGHT EMITTING APPARATUS AND ELECTRONIC DEVICE WITH COMPACT OVERLAPPING CONNECTION REGION

(71) Applicant: SEIKO EPSON CORPORATION, Tokyo (JP)

(72) Inventors: Takeshi Koshihara, Matsumoto (JP); Takeshi Nomura, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/590,277

(22) Filed: Jan. 6, 2015

(65) Prior Publication Data
US 2015/0206933 A1    Jul. 23, 2015

(30) Foreign Application Priority Data
Jan. 22, 2014   (JP) .................. 2014-009767

(51) Int. Cl.
*H01L 27/32*   (2006.01)
*H01L 51/52*   (2006.01)

(52) U.S. Cl.
CPC ........ *H01L 27/3276* (2013.01); *H01L 27/3262* (2013.01)

(58) Field of Classification Search
None
See application file for complete search history.

(56) References Cited

U.S. PATENT DOCUMENTS

| | | | |
|---|---|---|---|
| 8,704,234 B2* | 4/2014 | Kubota et al. | 257/72 |
| 2005/0112813 A1* | 5/2005 | Kim et al. | 438/197 |
| 2007/0120118 A1 | 5/2007 | Kubota et al. | |
| 2012/0119667 A1* | 5/2012 | Kitazawa et al. | 315/228 |
| 2013/0093737 A1* | 4/2013 | Ota et al. | 345/204 |
| 2014/0131701 A1* | 5/2014 | Watanabe et al. | 257/43 |

FOREIGN PATENT DOCUMENTS

| | | |
|---|---|---|
| JP | 2003-140185 A | 5/2003 |
| JP | 2003-229574 A | 8/2003 |
| JP | 2007-148216 A | 6/2007 |
| JP | 2013-088611 A | 5/2013 |
| JP | 2013-113868 A | 6/2013 |

* cited by examiner

*Primary Examiner* — Joseph Schoenholtz
(74) *Attorney, Agent, or Firm* — Oliff PLC

(57) ABSTRACT

There is provided a light emitting apparatus provided with a pixel circuit which is provided with a plurality of transistors including a first transistor and a light emitting element in which a current is supplied by the first transistor, in which, in at least one of the plurality of transistors, a wiring is connected to a gate electrode at a position overlapping a channel region in plan view.

20 Claims, 17 Drawing Sheets

▒ : ELEMENT SEPARATION PORTION
(GROOVE PORTION)

P CHANNEL TYPE

N CHANNEL TYPE

LIGHT EMITTING APPARATUS AND ELECTRONIC DEVICE WITH COMPACT OVERLAPPING CONNECTION REGION

BACKGROUND

1. Technical Field

The present invention relates to a light emitting apparatus and an electronic device.

2. Related Art

In the related art, as a display apparatus of an electronic device, a light emitting apparatus in which a plurality of organic electroluminescence (hereinafter, abbreviated as EL) elements are arranged in a matrix, has been used (for example, JP-A-2007-148216).

In JP-A-2007-148216, as a circuit for driving an organic EL, a pixel circuit provided with a plurality of transistors is described.

However, in the light emitting apparatus as described above, since a gate electrode and a gate wiring of a transistor were formed on the same layer, it is necessary to provide a wiring so as not to overlap a transistor in plan view, and thus the miniaturization of a pixel circuit became difficult.

In regards to this problem, a configuration in which a gate electrode and a wiring are separated to respectively provide on other layers has been proposed (for example, JP-A-2013-113868).

According to such a configuration, since it is possible to provide a wiring at the position overlapping a transistor in plan view, it is possible to miniaturize a pixel circuit in comparison with a case where a gate electrode layer serves as a wiring.

However, in the configuration as described above, since the gate electrode and the wiring are connected at a part for a connection wiring (a contact pad portion) provided outward than a channel region in the gate electrode, it was necessary to form the gate electrode larger than the channel region. Therefore, there have been problems such that there was a limitation to miniaturize a pixel circuit.

SUMMARY

An advantage of some aspects of the invention is to provide a light emitting apparatus capable of further miniaturizing a pixel circuit and an electronic device provided with such a light emitting apparatus.

According to an aspect of the invention, there is provided a light emitting apparatus provided with a pixel circuit which is provided with a plurality of transistors including a first transistor and a light emitting element in which a current is supplied by the first transistor, in which, in at least one of the plurality of transistors, a wiring is connected to a gate electrode at a position overlapping a channel region in plan view.

In the light emitting apparatus according to an aspect of the invention, since, in at least one of the plurality of transistors, the wiring is connected to the gate electrode at the position overlapping the channel region in plan view, it is not necessary to provide a contact pad portion for a connection wiring outward than the channel region in the gate electrode. Therefore, the size of the gate electrode can be set to approximately equal to that of the channel region. Thereby, in the light emitting apparatus according to an aspect of the invention, it is possible to obtain the light emitting apparatus capable of further miniaturizing the pixel circuit.

The plurality of transistors preferably include a selecting transistor provided between a gate of the first transistor and a signal line for inputting a signal into a gate of the first transistor, in which the selecting transistor may be set to a configuration in which a wiring is connected to a gate electrode at a position overlapping a channel region in plan view.

According to this configuration, it is possible to miniaturize the selecting transistor and, as a result, it is possible to miniaturize the pixel circuit.

The plurality of transistors preferably include a compensation transistor provided between a gate of the first transistor and one current terminal of the first transistor, in which the compensation transistor may be set to a configuration in which a wiring is connected to a gate electrode at a position overlapping a channel region in plan view.

According to this configuration, it is possible to miniaturize the compensation transistor and, as a result, it is possible to miniaturize the pixel circuit.

The plurality of transistors preferably include a light emitting control transistor provided between the first transistor and the light emitting element, in which the light emitting control transistor may be set to a configuration in which a wiring is connected to a gate electrode at a position overlapping a channel region in plan view.

According to this configuration, it is possible to miniaturize the light emitting control transistor and, as a result, it is possible to miniaturize the pixel circuit.

The plurality of transistors preferably include a reset transistor for feeding a predetermined reset potential in the light emitting element, in which the reset transistor may be set to a configuration in which a wiring is connected to a gate electrode at a position overlapping a channel region in plan view.

According to this configuration, it is possible to miniaturize the reset transistor and, as a result, it is possible to miniaturize the pixel circuit.

The first transistor is preferably set to a configuration in which a wiring is connected to a gate electrode at a position overlapping a channel region in plan view.

According to this configuration, it is possible to miniaturize the first transistor and, as a result, it is possible to miniaturize the pixel circuit.

The pixel circuit is preferably set to a configuration having a characteristic compensation circuit.

According to this configuration, since it is possible to suppress a variation in threshold voltage of the first transistor for supplying a current to the light emitting element, it is possible to stabilize a current which is supplied to the light emitting element.

The wiring is preferably set to a configuration in which the wiring is provided on a different layer from that on which the plurality of transistors are provided.

According to this configuration, a wiring is easily connected to a gate electrode at a position overlapping a channel region in plan view.

The wiring is preferably set to a configuration in which the wiring overlaps at least two of the plurality of transistors in plan view.

According to this configuration, it is possible to further miniaturize the pixel circuit.

According to a further aspect of the invention, there is provided a light emitting apparatus provided with a pixel circuit which is provided with a plurality of transistors including a first transistor and a light emitting element in which a current is supplied by the first transistor, in which the plurality of transistors include a second transistor provided between the first transistor and the light emitting element and in which, in the second transistor, a wiring is connected to a gate electrode at a position overlapping a channel region in plan view.

In the light emitting apparatus according to an aspect of the invention, since, in the second transistor, the wiring is connected to the gate electrode at the position overlapping the channel region in plan view, it is not necessary to provide a contact pad portion for a connection wiring in the gate electrode of the second transistor, and thus it is possible to make the gate electrode small. Therefore, in the light emitting apparatus according to the aspect of the invention, it is possible to obtain the light emitting apparatus capable of further miniaturizing the pixel circuit.

A position at which the wiring in the gate electrode is connected is preferably set to a configuration in which a position is closer to a current terminal of the side which becomes a high potential of a pair of current terminals with the gate electrode therebetween.

According to this configuration, it is possible to suppress a variation in threshold voltage of the transistor.

The light emitting element is preferably set to a configuration in which the light emitting element is an organic electroluminescence element.

According to this configuration, it is possible to use the light emitting apparatus as a display apparatus of an electronic device.

According to a still further aspect of the invention, there is provided an electronic device provided with the light emitting apparatus.

In the electronic device according to an aspect of the invention, since the light emitting apparatus is provided, it is possible to further miniaturize the electronic device.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, description will be given of a light emitting apparatus and an electronic device according to an embodiment of the invention with reference to drawings.

Moreover, a range of the invention is not limited to the following embodiments and can be arbitrarily changed within a range of a technical idea of the invention. In addition, in the following drawings, there are some cases where a scale reduction, the number, and the like in an actual structure are made different from those in each structure so as to easily understand each configuration.

Light Emitting Apparatus

First Embodiment

Figure 1:
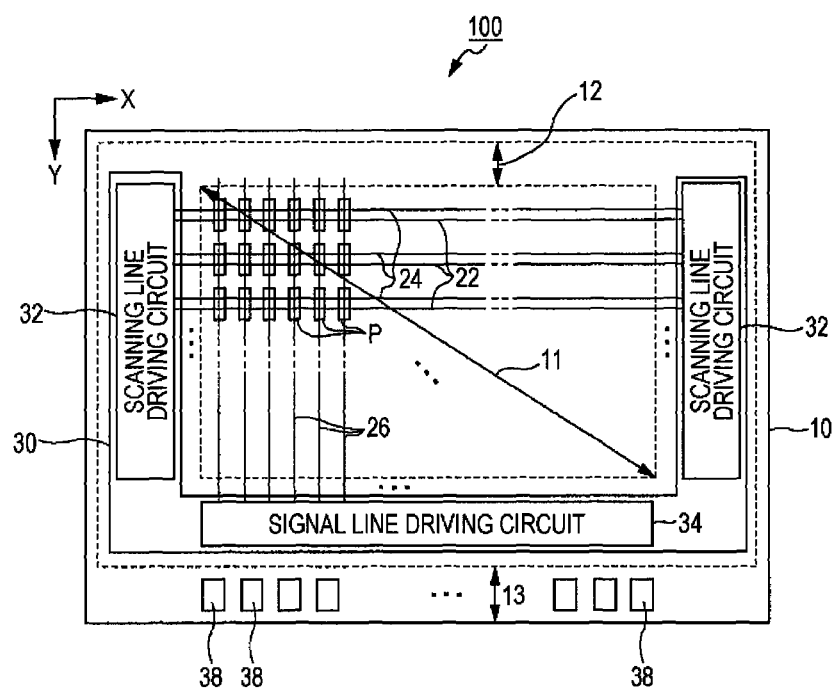
FIG. 1 is a plan view showing a light emitting apparatus of a first embodiment.

FIG. 1 is a plan view showing a light emitting apparatus 100 of the embodiment.

As shown in FIG. 1, the light emitting apparatus 100 of the embodiment is an organic EL apparatus in which the light emitting element using an organic EL material is formed on a semiconductor substrate 10. The light emitting apparatus 100 is, for example, an organic light emitting diode (OLED). The semiconductor substrate 10 is a plate-like member which is formed of a semiconductor material such as silicon and is used as a base material in which a plurality of light emitting elements are formed.

As shown in FIG. 1, a display region 11, a peripheral region 12, and a mounting region 13 are provided on the surface of the semiconductor substrate 10. The display region 11 is a region in a rectangular shape in which a plurality of pixel circuits P are arrayed. In display region 11, a plurality of scanning lines (wirings) 22 extending in an X direction, a plurality of control lines (wirings) 24 extending in an X direction in response to each scanning line 22, and a plurality of signal lines 26 extending in a Y direction intersecting with an X direction are formed. The pixel circuit P is a region in response to each intersection between a plurality of scanning lines 22 and a plurality of signal lines 26. Therefore, a plurality of pixel circuits P are arrayed in a matrix shape over an X direction and a Y direction.

The peripheral region 12 is a region in a rectangular frame shape surrounding the display region 11. A driving circuit 30 is provided in the peripheral region 12. The driving circuit 30 is a circuit which drives each pixel circuit P in the display region 11. The driving circuit 30 includes two scanning line driving circuits 32 and a signal line driving circuit 34. The light emitting apparatus 100 is a circuit built-in type display apparatus configured of an active element such as a transistor in which the driving circuit 30 is directly formed on the surface of the semiconductor substrate 10. Moreover, a dummy pixel which does not directly contribute to an image display may be formed in the peripheral region 12.

The mounting region 13 is provided in a region on the opposite side to the display region 11 with the peripheral region 12 therebetween (that is, the outside of the peripheral region 12). In the mounting region 13, a plurality of mounting terminals 38 are arrayed. A control signal or a power source potential is supplied to the mounting terminal 38 from various kinds of external circuits (not shown) such as a control circuit or a power source circuit. The external circuit is mounted on, for example, a wiring substrate (not shown) which is joined to the mounting region 13 and is flexible.

Figure 2:
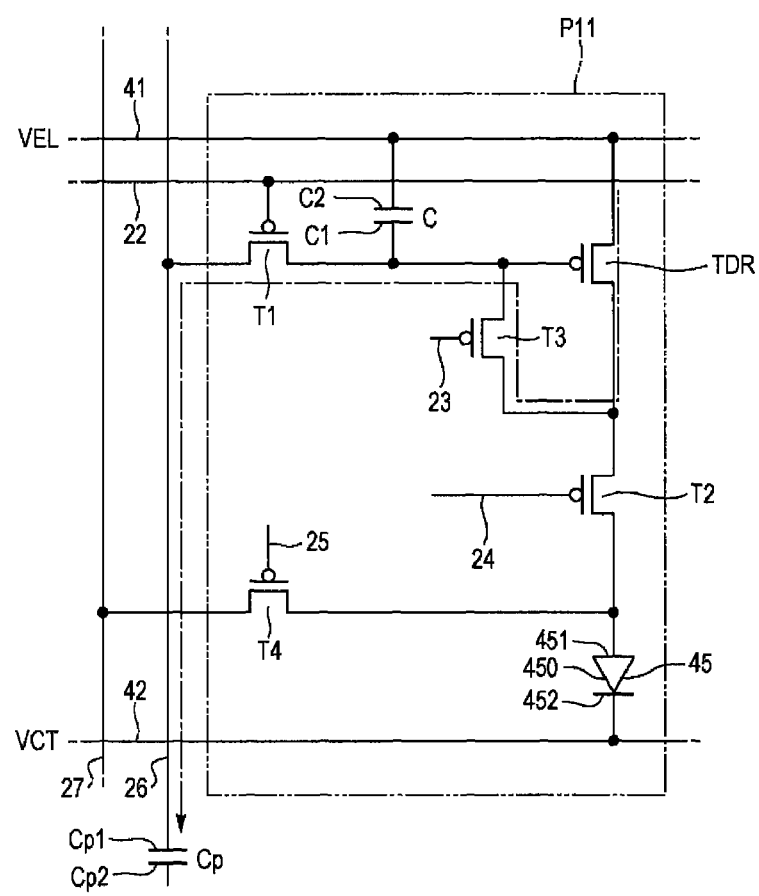
FIG. 2 is a circuit diagram showing a pixel circuit of a first embodiment.

FIG. 2 is a circuit diagram showing one pixel circuit P11 in a display region 11.

As shown in FIG. 2, the pixel circuit P11 is provided with a light emitting element 45, a driving transistor (first transistor) TDR, a selecting transistor T1, a light emitting control transistor (second transistor) T2, a compensation transistor T3, a reset transistor T4, and a capacitive element C. Moreover, in the first embodiment, the transistors TDR and T1 to T4 in the pixel circuit P11 are configured of a P channel type transistor, however, can be configured of an N channel type transistor. It is possible to operate this pixel circuit P11, for example, as a method of driving shown in FIG. 13A to FIG. 17 and an illustration thereof in JP-A-2013-088611.

The light emitting element 45 is an electrooptic element in which a light emitting functional layer 450 including a light emitting layer using an organic EL material is interposed between a pixel electrode (anode) 451 and a common electrode (cathode) 452. The pixel electrode 451 is independently formed for a pixel circuit P and the common electrode 452 is continuously formed over a plurality of pixel circuits P. As shown in FIG. 2, the light emitting element 45 is arranged on a current path connecting a first power source conductor 41 with a second power source conductor 42. The first power source conductor 41 is a power source wiring in which a power source potential VEL on the high potential side is supplied. The second power source conductor 42 is a power source wiring in which a power source potential VCT on the low potential side is supplied.

The driving transistor TDR is connected in series with respect to the light emitting element 45 on a current path connecting the first power source conductor 41 with the second power source conductor 42. Specifically, one terminal (source) of a pair of current terminals of the driving transistor TDR is connected to the first power source conductor 41. The other terminal (drain) of a pair of current terminals of the driving transistor TDR is connected to the pixel electrode 451 of the light emitting element 45. The driving transistor TDR generates a driving current equivalent to the current amount corresponding to the voltage between the gate and the source itself.

The selecting transistor T1 shown in FIG. 2 functions as a switch for controlling a conduction state (conduction/non-conduction) between the signal line 26 and the gate of the driving transistor TDR. The gate of the selecting transistor T1 is connected to the scanning line 22. The source of the selecting transistor T1 is connected to the signal line 26. The drain of the selecting transistor T1 is connected to the gate of the driving transistor TDR, the drain of the light emitting control transistor T2, and a first electrode C1 of the capacitive element C described below.

Moreover, in an operation in a characteristic compensation described below, since the direction of a current which flows to the selecting transistor T1 is reversed, the relation between the source and the drain of the selecting transistor T1 becomes reverse, however, in the embodiment in the specification, in a period in which a potential corresponding to the gradation level of the light emitting element is written to the gate of the driving transistor, description will be given of the relation between the source and the drain in the direction of a current which flows to the selecting transistor.

The light emitting control transistor T2 is connected in series between the driving transistor TDR and the light emitting element 45. Specifically, the source of the light emitting control transistor T2 is connected to the drain of the driving transistor TDR and the drain of the light emitting control transistor T2 is connected to the pixel electrode 451 of the light emitting element 45. The gate of the light emitting control transistor T2 is connected to the control line 24.

In the light emitting control transistor T2, the ON/OFF is controlled by a control signal which is input from the scanning line driving circuit 32 (refer to FIG. 1) into the gate through the control line 24. In a state in which the light emitting control transistor T2 is controlled into an ON state, the driving current is supplied to the light emitting element 45 through the light emitting control transistor T2 from the driving transistor TDR. At that time, the light emitting element 45 emits light with brightness corresponding to the current amount of the driving current. In a state in which the light emitting control transistor T2 is controlled into an OFF state, the supply of the driving current to the light emitting element 45 is interrupted. At that time, the light emitting element 45 is turned off.

The capacitive element C is an electrostatic capacity in which a dielectric is interposed between a first electrode C1 and a second electrode C2. The first electrode C1 is connected to the gate of the driving transistor TDR. The second electrode C2 is connected to the first power source conductor 41 (the source of the driving transistor TDR). Therefore, the capacitive element C retains the voltage between the gate and the source of the driving transistor TDR.

The compensation transistor T3 is a transistor for compensating a variation in current value which is supplied to the light emitting element 45 caused by a variation in threshold voltage of the driving transistor TDR. The source of the compensation transistor T3 is connected to the drain of the driving transistor TDR and the source of the light emitting control transistor T2. The drain of the compensation transistor T3 is connected to the gate of the driving transistor TDR. The gate of the compensation transistor T3 is connected to a control line (wiring) 23. In the compensation transistor T3, the ON/OFF is controlled by a control signal from the control line 23.

When the compensation transistor T3, the driving transistor TDR, and the selecting transistor T1 turn to an ON state, a current which flows to the source and the drain of the driving transistor TDR flows to the signal line 26 through the compensation transistor T3 and the selecting transistor T1. Here, in the embodiment, a first capacitive electrode Cp1 of a capacitive element Cp is connected to the signal line 26. Thereby, as to the potential from the gate of the driving transistor TDR to the first capacitive electrode Cp1 of the capacitive element Cp, the voltage between the source and the gate of the driving transistor TDR increases toward a threshold voltage. Ideally, as to the potential from the gate of the driving transistor 151 to the first capacitive electrode Cp1 of the capacitive element Cp, the voltage between the source and the gate of the driving transistor 151 reaches the threshold voltage and a current which flows to the source and the drain of the driving transistor 151 stops flowing. When the compensation transistor 153 turns to an OFF state, the voltage between the source and the gate of this driving transistor 151 is stored in the capacitive element C.

Then, in an OFF state of the compensation transistor T3, when a signal corresponding to the gradation level of the light emitting element 45 is input into a second capacitive electrode Cp1 of the capacitive element Cp, the potential from the gate of the driving transistor TDR to the first capacitive electrode Cp1 is sifted upward corresponding to the gradation level. Thereby, the voltage value between the source and the gate of the driving transistor TDR becomes a value in which the voltage corresponding to the gradation level is added to the threshold voltage. That is, the voltage between the source and the gate of the driving transistor TDR becomes a value in which the threshold voltage is compensated. Therefore, it is possible to stably supply a current corresponding to the gradation level, with respect to the light emitting element 45, regardless of the value of the threshold voltage of the driving transistor TDR.

As described above, the threshold voltage characteristics of the driving transistor TDR are compensated. That is, the pixel circuit P11 has a characteristic compensation circuit configured of the compensation transistor T3, the capacitive element Cp, or the like.

The reset transistor T4 is a transistor for resetting the potential of the light emitting element 45. The source of the reset T4 is connected to the drain of the light emitting control transistor T2 and the pixel electrode 451 of the light emitting element 45. The drain of the reset transistor T4 is connected to a third power source conductor 27. The third power source conductor 27 is a power source wiring to which the potential (reset potential) resetting the light emitting element 45 is supplied. The gate of the reset transistor T4 is connected to a control line (wiring) 25. In the reset transistor T4, the ON/OFF is controlled by a control signal from the control line 25.

In a period in which the light emitting element 45 is initialized, the reset transistor T4 turns to an ON state and the light emitting control transistor T2 turns to an OFF state. Thereby, the light emitting element 45 is connected to third power source conductor 27 through the reset transistor T4 and the potential of the light emitting element 45 is reset to the potential of the third power source conductor 27.

There are some cases where a parasitic capacitance is generated in the light emitting element 45, and when the parasitic capacitance is generated, the voltage between the pixel electrode 451 and the common electrode 452 of the light emitting element 45 due to the parasitic capacitance is retained. Therefore, for example, in a case such that the light emitting element 45 is changed from the high brightness state to the low brightness state, the high voltage in the high brightness state is retained in the parasitic capacitance, and thus an excessive current flows to the light emitting element 45 and it becomes difficult to set the light emitting element 45 to the low brightness state.

In contrast, it becomes easy to change the light emitting element 45 from the high brightness state to the low brightness state by resetting the potential of the light emitting element 45 using the reset transistor T4 as described above.

The signal line driving circuit 34 shown in FIG. 1 supplies an image signal supplied from the external circuit in parallel with respect to a plurality of signal lines 26 for a writing period (horizontal scanning period) as a gradation potential (data signal) corresponding to the gradation prescribed for a pixel circuit P. On the other hand, the scanning line driving circuit 32 sequentially selects each of a plurality of scanning lines 22 for a writing period by supplying a scanning signal to each of a plurality of scanning lines 22. The selecting transistor T1 in the pixel circuit P in response to the scanning line 22 selected by the scanning line driving circuit 32 transits to an ON state. At this time, the gradation potential is supplied to the gate of the driving transistor TDR in each pixel circuit P through the signal line 26 and the selecting transistor T1 and the voltage corresponding to the gradation potential is retained in the capacitive element C.

On the other hand, when the selection of the scanning line 22 in a writing period is finished, the scanning line driving circuit 32 controls the light emitting control transistor T2 in the pixel circuit P in response to the control line 24 to an ON state by supplying a control signal to each control line 24. Therefore, the driving current corresponding to the voltage retained in capacitive element C in a writing period immediately before is supplied to the light emitting element 45 from the driving transistor TDR through the light emitting control transistor T2. As describe above, when the light emitting element 45 emits light with brightness corresponding to the gradation potential, an arbitrary image specified by an image signal is displayed in the display region 11.

Next, description will be given of a specific configuration of the pixel circuit P11.

Figure 3:
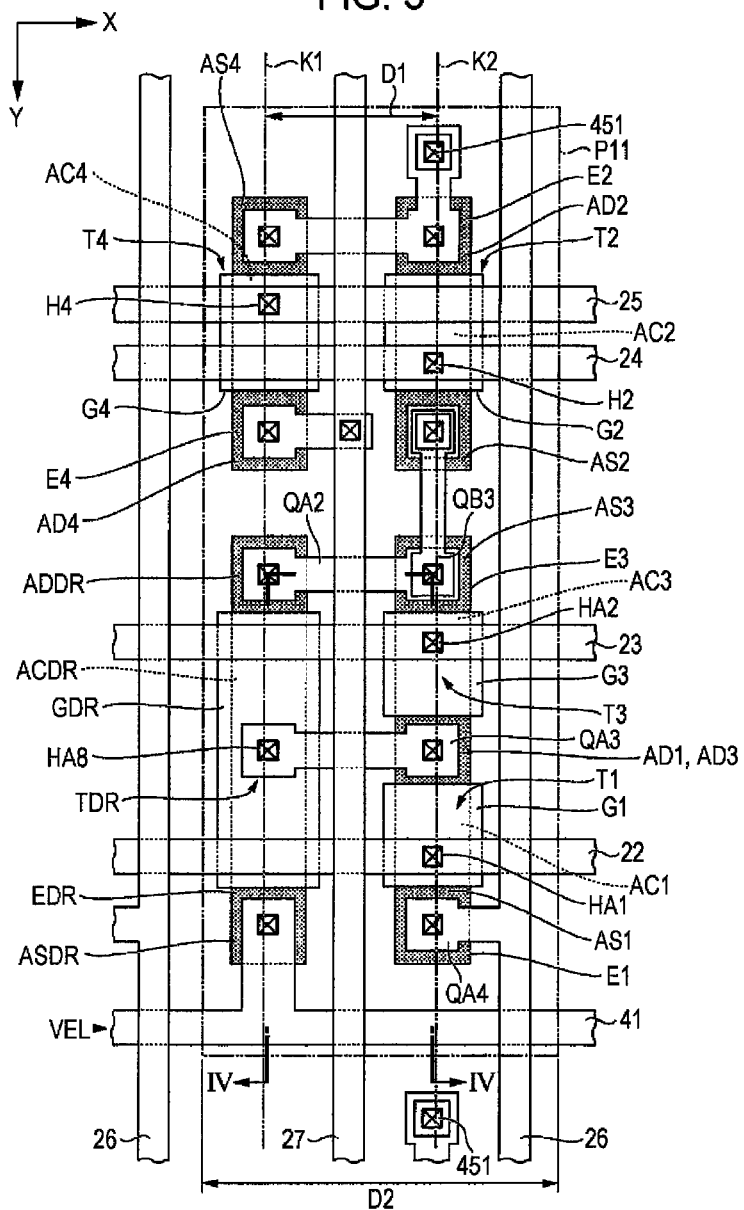
FIG. 3 is a plan view showing a pixel circuit of the first embodiment.
Figure 4:
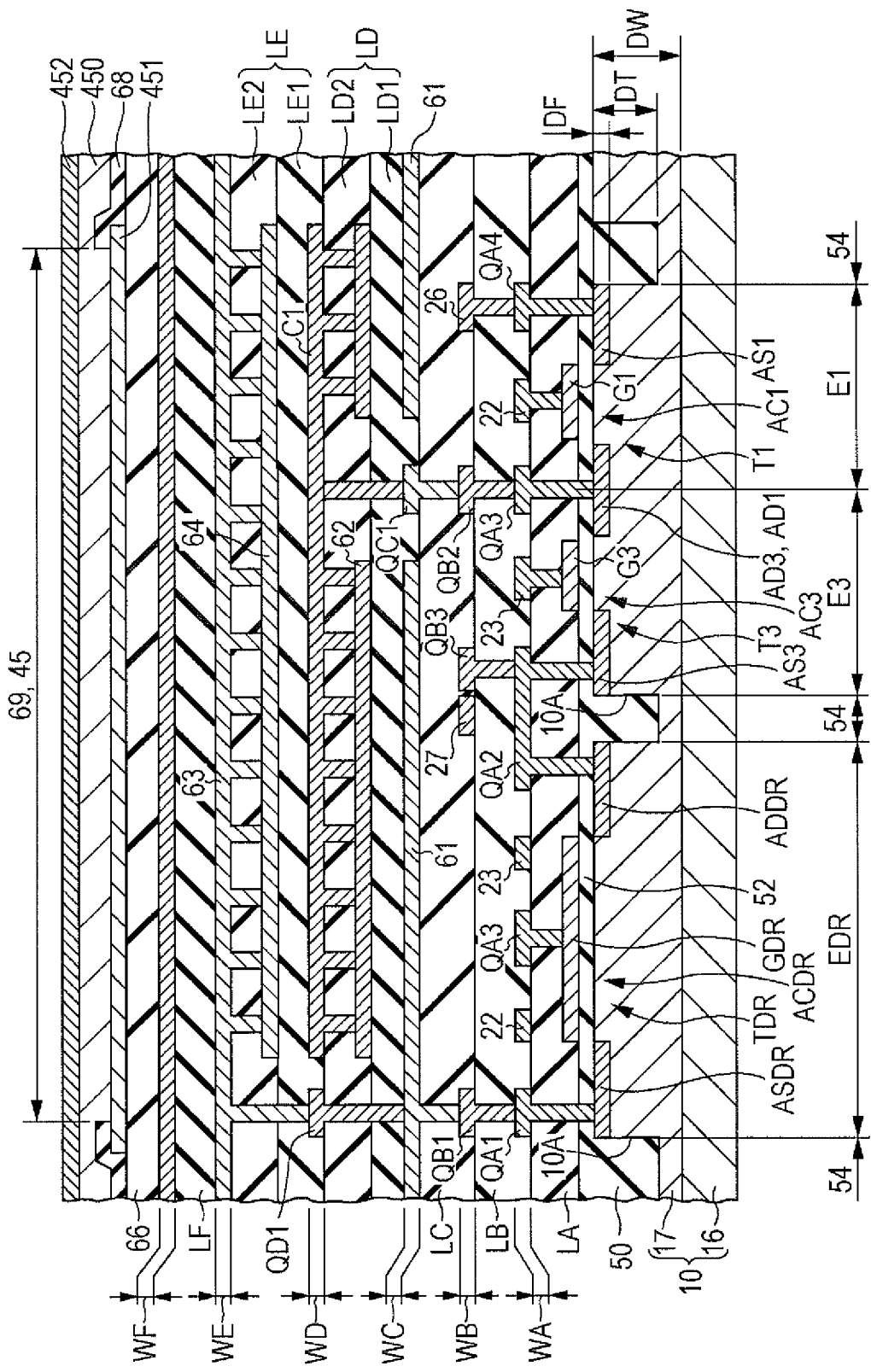
FIG. 4 is a view showing a pixel circuit of the first embodiment and is a sectional view of Iv-Iv in FIG. 3.

FIG. 3 is a plan view schematically showing a pixel circuit P11. FIG. 4 is a sectional view of IV-IV in FIG. 3. FIG. 5 to FIG. 12 are plan views showing a case of viewing each layer in FIG. 4 in plan view. In FIG. 5 to FIG. 12, hatching similar to FIG. 4 is added to each element in common with FIG. 4 for the sake of convenience, from the viewpoint of facilitating the visual grasping of each element.

In the embodiment, each transistor is, for example, a metal oxide semiconductor field effect transistor (MOSFET).

Each of the transistors TDR, T1, T2, T3, and T4 of the embodiment is formed on the surface of the semiconductor substrate 10 as shown in FIG. 4. In more detail, each of the transistors TDR, T1, T2, T3, and T4 is formed by using a p type well 17 formed on the surface of an N type base substance 16 in the semiconductor substrate 10. Moreover, as to the light emitting control transistor T2 and the reset transistor T4, an illustration is omitted in FIG. 4.

As shown in FIG. 3, the driving transistor TDR is provided with an element portion EDR and a gate electrode GDR. In the element portion EDR, a source region ASDR, a drain region ADDR, and a channel region ACDR are formed.

The selecting transistor T1 is provided with an element portion E1 and a gate electrode G1. In the element portion E1, a source region AS1, a drain region AD1, and a channel region AC1 are formed.

The light emitting control transistor T2 is provided with an element portion E2 and a gate electrode G2. In the element portion E2, a source region AS2, a drain region AD2, and a channel region AC2 are formed.

The compensation transistor T3 is provided with an element portion E3 and a gate electrode G3. In the element portion E3, a source region AS3, a drain region AD3, and a channel region AC3 are formed. In the embodiment, the drain region AD3 of the compensation transistor T3 also functions as a drain region AD1 of the selecting transistor T1.

The reset transistor T4 is provided with an element portion E4 and a gate electrode G4. In the element portion E4, a source region AS4, a drain region AD4, and a channel region AC4 are formed.

Moreover, in the embodiment, since the configurations of each transistor are similar, there are some cases where description will be given of only driving transistor TDR on behalf of each transistor in the following description.

As shown in FIG. 3 and FIG. 4, the element portions EDR, E1, and E3 are formed in the well 17 of the semiconductor substrate 10. An illustration is omitted in FIG. 4 but the element portions E2 and E4 of the light emitting control transistor T2 and the reset transistor T4 are the same as the element portions EDR, E1, and E3.

In the embodiment, as shown in FIG. 3 and FIG. 4, as to the element portion E1 of the selecting transistor T1 and the element portion E3 of the compensation transistor T3, the drain region AD1 and the drain region AD3 are in common, respectively. In addition, as shown FIG. 4, the element portion EDR of the driving transistor TDR and the element portions E1 and E3 of the selecting transistor T1 and the compensation transistor T3 are formed in an island shape mutually isolated by a groove portion (trench) 10A formed in the well 17 of the semiconductor substrate 10. In FIG. 4, an illustration is omitted but the element portions E2 and E4 of the light emitting control transistor T2 and the reset transistor T4 are formed in an island shape mutually isolated in the same way.

The groove portion 10A which defines each element portion is a region in which the well 17 formed on the surface of the semiconductor substrate 10 is partially removed.

The depth DT of the groove portion 10A exemplified FIG. 4 is a distance between the surface of the semiconductor substrate 10 (well 17) and the bottom surface of the groove portion 10A. The depth DT of the groove portion 10A is set to a size (for example, approximately several hundred nm) within a range, for example, from 300 nm to 1,000 nm. As understood from FIG. 4, the depth DT of the groove portion 10A is below the thickness DW of the well 17 (DT<DW). Therefore, the bottom surface of the groove portion 10A is configured of the well 17.

An element isolation portion 54 is formed inside of the groove portion 10A (that is, between each element portion). The element isolation portion 54 functions as an element for electrically insulating (element isolation) each transistor. That is, in the embodiment, the element isolation portion 54 having a shallow trench isolation (STI) structure which electrically isolates each transistor is formed. Specifically, the element isolation portion 54 isolates the driving transistor TDR, the selecting transistor T1, and the compensation transistor T3, and the light emitting control transistor T2 and the reset transistor T4 (not shown).

As shown in FIG. 4, the thickness (the depth of the groove portion 10A) DT of the element isolation portion 54 in the embodiment exceeds the thicknesses DF of the source region ASDR and the drain region ADDR. Therefore, there is an advantage in which a leak of current between the source region and the drain region of each transistor adjacent to each other is suppressed (it is possible to certainly isolate each transistor) in comparison with a configuration in which the thickness DT of the element isolation portion 54 is below the thickness DF of the source region ASDR or the drain region ADDR.

Figure 5:
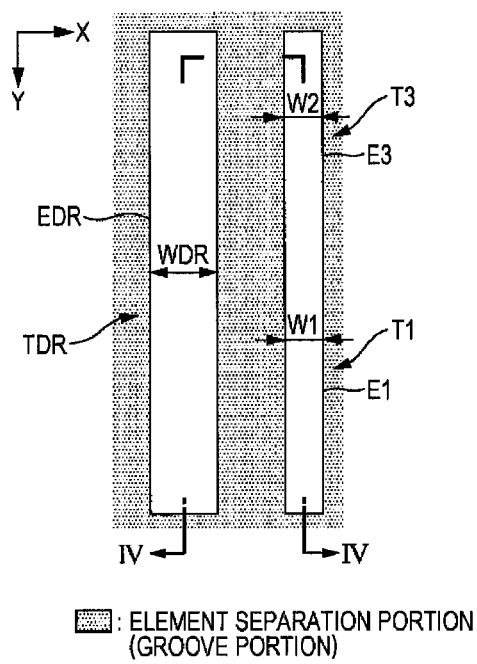
FIG. 5 is a plan view showing a pixel circuit of the first embodiment.

In the embodiment, as shown in FIG. 3 and FIG. 5, each element portion is formed in a belt-like shape extending in a Y direction in plan view (XY surface view).

The element portion EDR of the driving transistor TDR and the element portion E4 of the reset transistor T4 are arranged so that the length direction becomes a Y direction and are provided side by side along a virtual straight line K1 parallel to a Y direction.

The element portion E1 of the selecting transistor T1 and the element portion E3 of the compensation transistor T3, and the element portion E2 of the light emitting control transistor T2 are arranged so the length direction becomes a Y direction and are provided side by side along a virtual straight line K2 parallel to a Y direction.

The virtual straight line K1 and the virtual straight line K2 are provided side by side in an X direction. That is, the element portions of five transistors in the pixel circuit P11 of the embodiment are provided side by side in two lines.

Moreover, in the embodiment, the length direction of the element portion in the transistor means a direction in which the source region and the drain region described below are aligned.

As shown in FIG. 3 and FIG. 4, the source region ASDR and the drain region ADDR are a region formed at each position with the gate electrode therebetween in plan view in the element portion EDR of the driving transistor TDR. The source region ASDR and the drain region ADDR are a region having a predetermined thickness in which reverse-conduction type (that is, N type) impurity ions are introduced and diffused with respect to the p type well 17.

An insulation layer 50 is formed on the face of the semiconductor substrate 10 (well 17) on which the element portion EDR is formed. The insulation layer 50 is formed of, for example, an inorganic material having insulation properties such as a silicon compound (typically, silicon nitride or silicon oxide) and is configured by including an insulation film 52 and the element isolation portion 54. The insulation film 52 is a part located on the face of each element portion in the insulation layer 50 and functions as a gate insulation film of each transistor.

Figure 6:
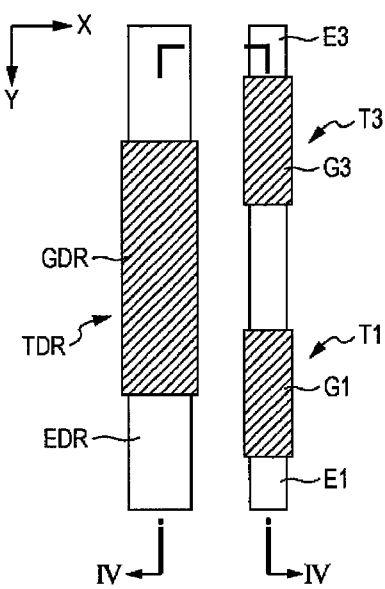
FIG. 6 is a plan view showing a pixel circuit of the first embodiment.

As shown in FIG. 4 and FIG. 6, the gate electrode GDR is formed on the face of the insulation layer 50. That is, the element portion EDR is opposed to the gate electrode GDR with the insulating film 52 therebetween (insulation layer 50). A part overlapping the gate electrode GDR in plan view in a region sandwiched by the source region ASDR and the drain region ADDR in the element portion EDR becomes the channel region ACDR.

As shown in FIG. 5 and FIG. 6, the channel width WDR of the driving transistor TDR exceeds the channel width W1 of the selecting transistor T1 and the channel width W2 of the compensation transistor T3. In the embodiment, the channel width W1 of the selecting transistor T1 is nearly equal to the channel width W2 of the compensation transistor T3. The channel width WDR of the driving transistor TDR is, for example, 500 nm.

As shown in FIG. 3, the gate electrode GDR of the driving transistor TDR is electrically connected to the drain region AD1 of the selecting transistor T1 through a relay electrode QA3. In the embodiment, the relay electrode (wiring) QA3 is electrically connected to the gate electrode GDR of the driving transistor TDR through a contact hole HA8. In the embodiment, the contact hole HA8 is provided at the position overlapping the channel region ACDR in plan view. In other words, in the driving transistor TDR, the gate electrode GDR is connected to the relay electrode QA3 at the position overlapping the channel region ACDR in plan view.

The gate electrode G1 of the selecting transistor 71 is electrically connected to the scanning line 22 through a contact hole HA1. The scanning line 22 is provided by extending in an X direction so as to pass above the driving transistor TDR and the selecting transistor T1. In other words, the scanning line 22 is provided so as to overlap the driving transistor TDR and the selecting transistor T1 in plan view.

The contact hole HA1 is provided at the position overlapping the channel region AC1 in plan view. In other words, in the selecting transistor T1, the gate electrode G1 is connected to the scanning line 22 at the position overlapping the channel region AC1 in plan view. The contact hole HA1 is provided at the position closer to the source region AS1 (closer to +Y) in the gate electrode G1.

The gate electrode G2 of the light emitting control transistor T2 is electrically connected to the control line 24 through a contact hole H2. The control line 24 is provided by extending in an X direction so as to pass above the light emitting control transistor T2 and the reset transistor T4. In other words, the control line 24 is provided so as to overlap the light emitting control transistor T2 and the reset transistor T4 in plan view.

The contact hole H2 is provided at the position overlapping the channel region AC2 in plan view. In other words, in the light emitting control transistor T2, the gate electrode G2 is connected to the control line 24 at the position overlapping the channel region AC2 in plan view. The contact hole H2 is provided at the position closer to the source region AS2 (closer to +Y) in the gate electrode G2.

The gate electrode G3 of the compensation transistor T3 is electrically connected to the control line 23 through a contact hole HA2. The control line 23 is provided by extending in an X direction so as to pass above the driving transistor TDR and the compensation transistor T3. In other words, the control line 23 is provided so as to overlap the driving transistor TDR and the compensation transistor T3 in plan view.

The contact hole HA2 is provided at the position overlapping the channel region AC3 in plan view. In other words, in the compensation transistor T3, the gate electrode G3 is connected to the control line 23 at the position overlapping the channel region AC3 in plan view. The contact hole HA2 is provided at the position closer to the source region AS3 (closer to −Y) in the gate electrode G3.

The gate electrode G4 of the reset transistor T4 is electrically connected to the control line 25 through a contact hole H4. The control line 25 is provided by extending in an X direction so as to pass above the light emitting control transistor T2 and the reset transistor T4. In other words, the control line 25 is provided so as to overlap the light emitting control transistor T2 and the reset transistor T4 in plan view.

The contact hole H4 is provided at the position overlapping the channel region AC4 in plan view. In other words, in the reset transistor T4, the gate electrode G4 is connected to the control line 25 at the position overlapping the channel region AC4 in plan view. The contact hole H4 is provided at the position closer to the source region AS4 (closer to −Y) in the gate electrode G4.

As exemplified in FIG. 4, a multilayer wiring layer in which a plurality of insulation layers L (LA to LF) and a plurality of wiring layers W (WA to WF) are alternately laminated is formed on the face of the insulation layer 50 on which the gate electrode of each transistor described above is formed. Each insulation layer L is formed of, for example, an inorganic material having insulation properties such as a silicon compound (typically, silicon nitride or silicon oxide). In addition, each wiring layer W is formed of a conductive material having low resistance and containing aluminum, silver, or the like. Moreover, in description below, the relation of which a plurality of elements are collectively formed through the same process by selectively removing a conductive layer (single layer or plural layers) is written as "formed from the same layer".

Hereinafter, description will be given of a multilayer wiring layer in detail.

Moreover, in the embodiment, description will be given with reference to a section of IV-IV in FIG. 3, that is, FIG. 4 showing sections of the driving transistor TDR, the selecting transistor T1, and the compensation transistor T3, as a description of a multilayer wiring layer.

Figure 7:
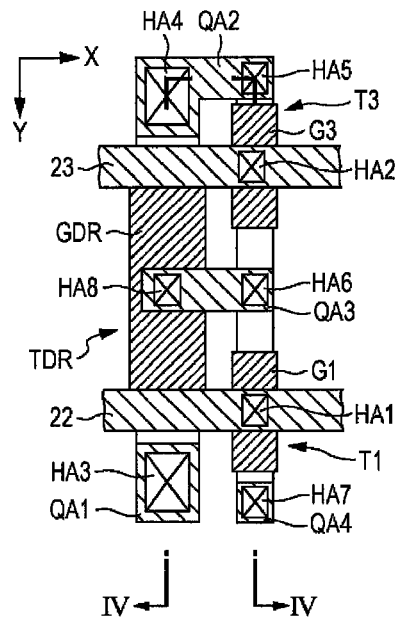
FIG. 7 is a plan view showing a pixel circuit of the first embodiment.

An insulation layer LA in FIG. 4 is formed on the face of the insulation layer 50 (insulation film 52) on which the gate electrode of each transistor are formed. As shown in FIG. 4 and FIG. 7, a conductor pattern including the scanning line 22, the control line 23, and a plurality of relay electrodes QA (QA1 to QA4) is formed from the same layer (wiring layer WA) on the face of the insulation layer LA. As described above, the scanning line 22 is conducted to the gate electrode G1 of the selecting transistor T1 through the contact hole HA1 penetrating the insulation layer LA and the control line 23 is conducted to the gate electrode G3 of the compensation transistor T3 through the contact hole HA2 penetrating the insulation layer LA.

A relay electrode QA1 is conducted to the source region ASDR of the driving transistor TDR through a contact hole HA3 penetrating the insulation layer LA and the insulation layer 50. As understood from FIG. 4 and FIG. 7, a relay electrode QA2 is conducted to the drain region ADDR of the driving transistor TDR through a contact hole HA4 penetrating the insulation layer LA and the insulation layer 50 and is conducted to the source region AS3 of the compensation transistor T3 through a contact hole HA5 penetrating the insulation layer LA and the insulation layer 50. Thereby, the drain region ADDR of the driving transistor TDR is connected to the source region AS3 of the compensation transistor T3.

The relay electrode QA3 is conducted to the drain region AD1 of the selecting transistor T1 and the drain region AD3 of the compensation transistor T3 through a contact hole HA6 penetrating the insulation layer LA and the insulation layer 50 and is conducted to the gate electrode GDR of the driving transistor TDR through a contact hole HA8 penetrating the insulation layer LA. That is, the gate electrode GDR of the driving transistor TDR is connected to the drain region AD1 of the selecting transistor T1 and the drain region AD3 of the compensation transistor T3.

A relay electrode QA4 is conducted to the source region AS1 of the selecting transistor T1 through a contact hole HA7 penetrating the insulation layer LA and the insulation layer 50.

Figure 8:
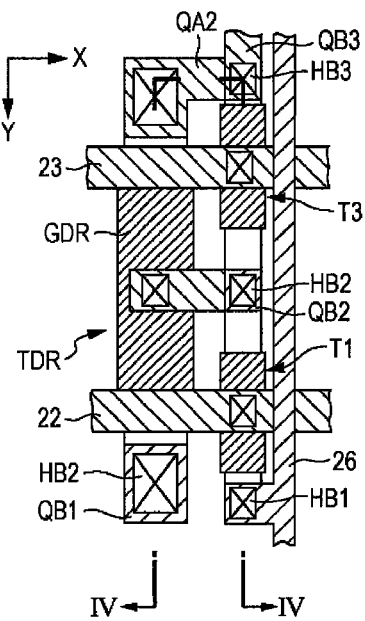
FIG. 8 is a plan view showing a pixel circuit of the first embodiment.

An insulation layer LB in FIG. 4 is formed on the face of the insulation layer LA on which the wiring layer WA is formed. As shown in FIG. 4 and FIG. 8, a conductor pattern including the signal line 26, the third power source conductor 27, and a plurality of relay electrodes QB (QB1 to QB3) is formed from the same layer (wiring layer WB) on the face of the insulation layer LB. Moreover, in FIG. 8, an illustration of the third power source conductor 27 is omitted.

As understood from FIG. 8, the signal line 26 is formed in a straight line shape by extending in a Y direction and is conducted to the relay electrode QA4 of the wiring layer WA through a contact hole HB1 penetrating the insulation layer LB. That is, as understood from FIG. 4 and FIG. 8, the signal line 26 is conducted to the source region AS1 of the selecting transistor T1 through the relay electrode QA4. In addition, the relay electrode QB1 is conducted to the relay electrode QA1 of the wiring layer WA through a contact hole HB2 penetrating the insulation layer LB. The relay electrode QB2 is conducted to the relay electrode QA3 (the gate electrode GDR of the driving transistor TDR) of the wiring layer WA through the contact hole HB2 penetrating the insulation layer LB. The relay electrode QB3 is conducted to the relay electrode QA2 of the wiring layer WA through a contact hole HB3 penetrating the insulation layer LB.

An insulation layer LC in FIG. 4 is formed on the face of the insulation layer LB on which the wiring layer WB is formed. As exemplified in FIG. 4 and FIG. 9, a conductor pattern including a first conductive layer 61 and a relay electrode QC1 is formed from the same layer (wiring layer WC)

on the face of the insulation layer LC. The first conductive layer 61 is continuously formed over whole display region 11 to configure the first power source conductor 41 in FIG. 2. Specifically, the first conductive layer 61 is electrically connected to the mounting terminal 38 (refer to FIG. 1) to which a high-order side power source potential VEL is supplied and is conducted to the relay electrode QB1 of the wiring layer WB through a contact hole HC1 penetrating the insulation layer LC as understood from FIG. 4 and FIG. 9. That is, the power source potential VEL which is supplied to the mounting terminal 38 reaches the source region ASDR of the driving transistor TDR through the first conductive layer 61, the relay electrode QB1, and the relay electrode QA1.

Figure 9:
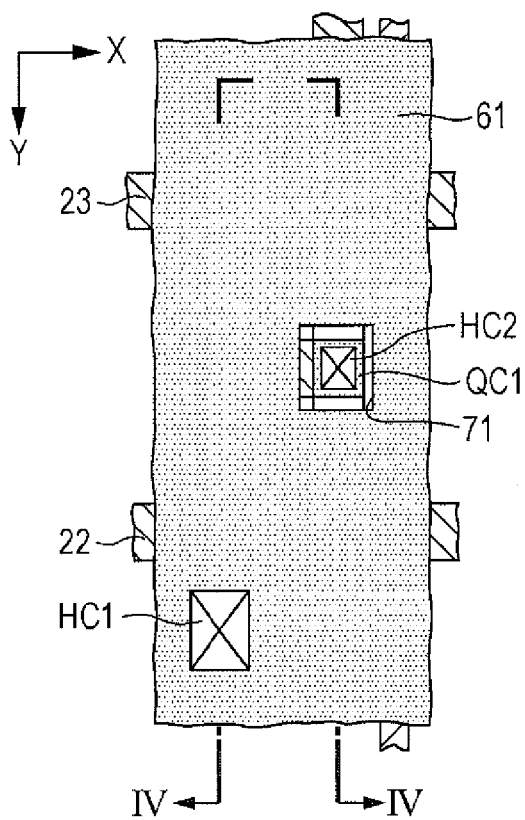
FIG. 9 is a plan view showing a pixel circuit of the first embodiment.

As exemplified in FIG. 9, in the first conductive layer 61, an opening portion 71 is formed for a pixel circuit P. The relay electrode QC1 is formed inside the opening portion 71. The relay electrode QC1 is conducted to the relay electrode QB2 of the wiring layer WB through a contact hole HC2 penetrating the insulation layer LC.

Figure 10:
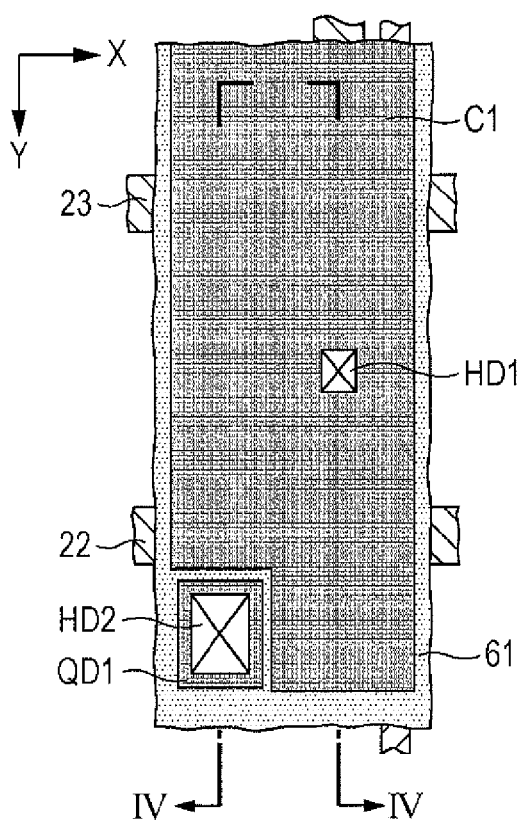
FIG. 10 is a plan view showing a pixel circuit of the first embodiment.

An insulation layer LD in FIG. 4 is formed on the face of the insulation layer LC on which the wiring layer WC is formed. As shown in FIG. 4 and FIG. 10, a conductor pattern including a first electrode C1 of the capacitive element C is formed from the same layer (wiring layer WD) on the face of the insulation layer LD. As understood from FIG. 10, the first electrode C1 is independently formed for a pixel circuit P and is conducted to the relay electrode QC1 of the wiring layer WC through a contact hole HD1 penetrating the insulation layer LD. Thereby, the first electrode C1 of the capacitive element C is electrically connected to the gate electrode GDR of the driving transistor TDR, the drain region AD1 of the selecting transistor T1, and the drain region AD3 of the compensation transistor T3 through the relay electrode QC1, the relay electrode QB2, and the relay electrode QA3.

As shown in FIG. 4 and FIG. 10, a relay electrode QD1 is conducted to the first conductive layer 61 of the wiring layer WC through the contact hole HD2 penetrating the insulation layer LD.

In FIG. 4, a configuration in which the insulation layer LD is formed by laminating a first layer LD1 and a second layer LD2 is exemplified. An auxiliary electrode 62 is formed on the face of the first layer LD1 (between the first layer LD1 and the second layer LD2). The first electrode C1 formed on the face of the insulation layer LD (second layer LD2) is conducted to the auxiliary electrode 62 through a plurality of contact holes penetrating the second layer LD2. The auxiliary electrode 62 is an auxiliary electrode for increasing the capacitance value of the capacitive element C. Moreover, a configuration in which the auxiliary electrode 62 is omitted (a configuration in which the insulation layer LD is formed with a single layer) can also be employed.

Figure 11:
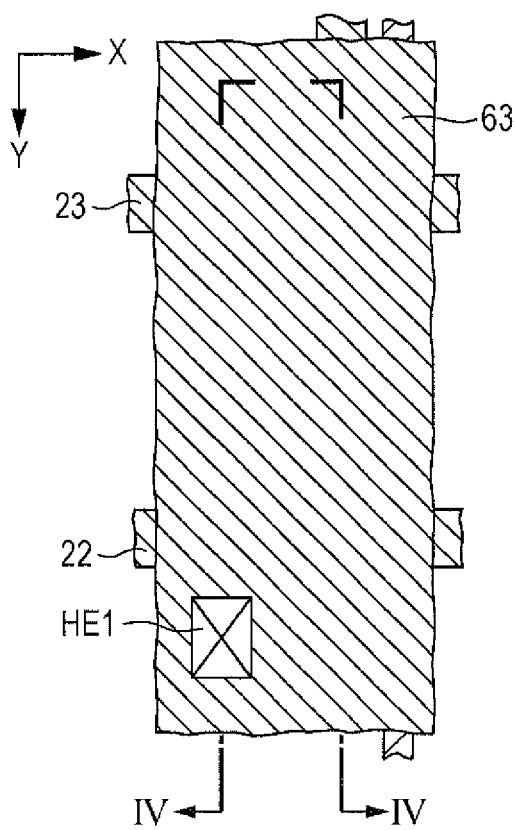
FIG. 11 is a plan view showing a pixel circuit of the first embodiment.

An insulation layer LE in FIG. 4 is formed on the face of the insulation layer LD on which the wiring layer WD is formed. As shown in FIG. 4 and FIG. 11, a conductor pattern including a second conductive layer 63 is formed from the same layer (wiring layer WE) on the face of the insulation layer LE. The wiring layer WE is formed of a conductive material having light reflecting properties and containing silver or aluminum.

The second conductive layer 63 is continuously formed over whole display region 11 in the same way as the first conductive layer 61 and is conducted to the relay electrode QD1 of the wiring layer WD through a contact hole HE1 penetrating the insulation layer LE. That is, the second conductive layer 63 is electrically connected to the first conductive layer 61 (refer to FIG. 9) through the relay electrode QD1. Therefore, the high-order side power source potential VEL is supplied to the second conductive layer 63 in the same way as the first conductive layer 61. As understood from the above-described description, the second conductive layer 63 configures the first power source conductor 41 in FIG. 2 together with the first conductive layer 61.

In FIG. 4, a configuration in which an insulation layer LE is formed by laminating a first layer LE1 and a second layer LE2 is exemplified. An auxiliary electrode 64 is formed on the face of the first layer LE1 (between the first layer LE1 and the second layer LE2). The second conductive layer 63 formed on the face of the insulation layer LE (second layer LE2) is conducted to the auxiliary electrode 64 through a plurality of contact holes penetrating the second layer LE2. The auxiliary electrode 64 is an auxiliary electrode for increasing the electrostatic capacitance of the capacitive element C in the same way as the auxiliary electrode 62. Moreover, a configuration in which the auxiliary electrode 64 is omitted (a configuration in which the insulation layer LE is formed with a single layer) can also be employed.

As understood from the above-described description, the capacitance in which the insulation layer LD is interposed between the first conductive layer 61 and the first electrode C1 (auxiliary electrode 62) and the capacitance in which the insulation layer LE is interposed between the second conductive layer 63 (auxiliary electrode 64) and the first electrode C1 function as a capacitive element C described above with reference to FIG. 2. As understood from the above-described description, the first conductive layer 61 and the second conductive layer 63 function as a second electrode C2 which forms the capacitive element C between the first power source conductor 41 which supplies the power source potential VEL and the first electrode C1.

An insulation layer LF in FIG. 4 is formed on the face of the insulation layer LE on which the wiring layer WE is formed. A conductor pattern (wiring layer WF) (not shown) is formed on the face of the insulation layer LF. The wiring layer WF is formed of, for example, a conductive material having light shielding properties (for example, titanium nitride).

As exemplified in FIG. 4, an optical path adjusting layer 66 is formed on the face of the insulation layer LF on which the wiring layer WF is formed. The optical path adjusting layer 66 is a film body having light transmissivity which defines a resonance wavelength of a resonance structure in each pixel circuit P and is formed of an insulating material having light transmissivity such as a silicon compound (typically, silicon nitride or silicon oxide). The pixel electrode 451 is independently formed on the face of the optical path adjusting layer 66 for a pixel circuit P. The pixel electrode 451 is formed of, for example, an insulating material having light transmissivity such as indium tin oxide (ITO).

Figure 12:
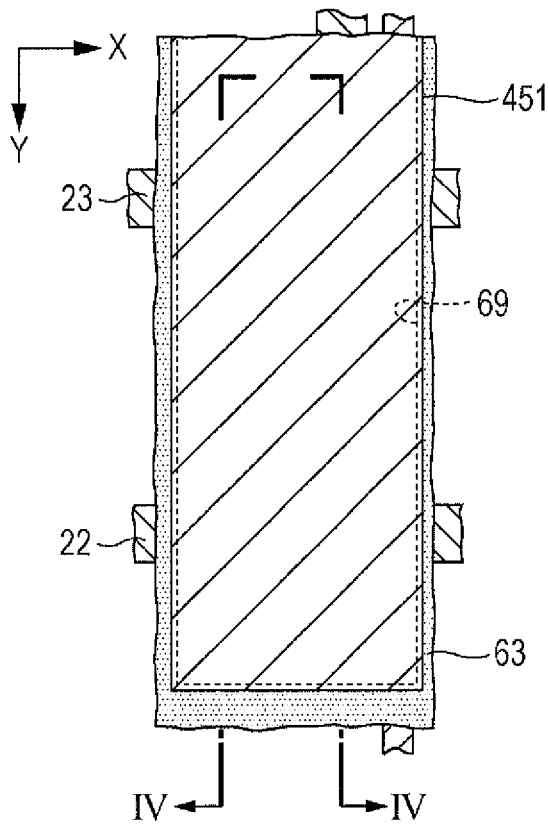
FIG. 12 is a plan view showing a pixel circuit of the first embodiment.

As shown in FIG. 12, the pixel electrode 451 is an electrode in an approximately rectangular shape which functions as an anode of the light emitting element 45. An illustration is omitted in FIG. 4 to FIG. 12 but the contact hole penetrating each layer is formed in the insulation layers LA to LF and the optical path adjusting layer 66 and the relay electrode is formed in the contact hole of each layer. Thereby, the pixel electrode 451 is electrically connected to the drain region AD2 of the light emitting control transistor T2.

As shown in FIG. 4, a pixel defining layer 68 is formed over the entire area of the semiconductor substrate 10 on the face of the optical path adjusting layer 66 on which the pixel electrode 451 is formed. The pixel defining layer 68 is formed of, for example, an inorganic material having insulation properties such as a silicon compound (typically, silicon nitride or silicon oxide). An opening portion 69 in response to the pixel electrode 451 is formed on the pixel defining layer 68. FIG.

12, the inner peripheral edge of the opening portion 69 on the pixel defining layer 68 is written down together by a broken line.

As exemplified in FIG. 4, the light emitting functional layer 450 is formed on the face of the optical path adjusting layer 66 on which the pixel electrode 451 and the pixel defining layer 68 are formed. The light emitting functional layer 450 is formed in the entire area of the display region 11 and is continuously provided over a plurality of pixel circuits P. The light emitting functional layer 450 of the embodiment is configured by including a light emitting layer formed of an organic EL material and emits white light by supplying a current. White light is light having a spectrum which is over a wavelength region of blue color, a wavelength region of green color, and a wavelength region of red color and at least two peaks are observed in a wavelength region of visible light. Moreover, it is possible to include a transport layer or an injection layer of an electron or a hole which is supplied to the light emitting layer in the light emitting functional layer 450.

As shown in FIG. 4, the common electrode 452 which functions as a cathode of the light emitting element 45 is formed on the face of the light emitting functional layer 450. The common electrode 452 is formed in the entire area of the semiconductor substrate 10 so as to continue over a plurality of pixel circuits P and is electrically connected to the mounting terminal 38 in which the power source potential VCT is supplied. Moreover, in actuality, a sealing layer having light transmissivity which prevents intrusion of an outside air and moisture is formed in the entire area of the semiconductor substrate 10 so as to cover the common electrode 452, however, an illustration thereof is omitted in FIG. 4.

As shown in FIG. 4, in the light emitting functional layer 450, a region (light emitting region) sandwiched by the pixel electrode 451 and the common electrode 452 inside the opening portion 69 of the pixel defining layer 68 emits light. That is, a part of which the pixel electrode 451, the light emitting functional layer 450, and the common electrode 452 are laminated inside the opening portion 69 of the pixel defining layer 68 functions as a light emitting element 45. As understood from description described above, the pixel defining layer 68 defines a planar shape or a size of the light emitting element 45 in each pixel circuit P. The light emitting apparatus 100 of the embodiment is, for example, a micro display in which the light emitting element 45 are arranged with very high definition. For example, an area (an area of the opening portion 69 of one pixel defining layer 68) of one light emitting element 45 is set to 40 μm² or less and the interval of each light emitting element 45 adjacent with each other in an X direction is set to 1.5 μm or less.

The common electrode 452 functions as a semitransmissive reflecting layer having properties (semitransmissive reflecting properties) in which a part of light which reaches the surface is transmitted and the rest is reflected. For example, when a conductive material having light reflecting properties such as an alloy containing silver or magnesium is formed into a sufficient thin film thickness, the common electrode 452 having semitransmissive reflecting properties is formed. After white light emitted from the light emitting functional layer 450 reciprocates between the second conductive layer 63 (first power source conductor 41) and the common electrode 452 and a component of a specific resonance wavelength is selectively amplified, white light is transmitted through the common electrode 452 and injected to the observation side (the opposite side of the semiconductor substrate 10). That is, the resonance structure resonating the injected light from the light emitting functional layer 450 between the second conductive layer 63 which functions as a reflecting layer and the common electrode 452 which functions as a semitransmissive reflecting layer is formed.

The above-described optical path adjusting layer 66 is an element for independently setting a resonance wavelength (display color) of a resonance structure for a display color of each pixel circuit P. Specifically, the resonance wavelength of injected light of each pixel circuit P is set for a display color by appropriately adjusting an optical path length (optical distance) between the second conductive layer 63 configuring the resonance structure and the common electrode 452 corresponding to the film thickness of the optical path adjusting layer 66.

The above is the specific structure of the light emitting apparatus 100 of the embodiment.

Next, description will be given of a method of forming a relay electrode electrically connected to a gate electrode, a source region, and a drain region of each transistor in the embodiment.

FIGS. 13A to 13E are sectional views showing a procedure of a method of forming a relay electrode connected to a transistor of the embodiment.

Figure 13A:
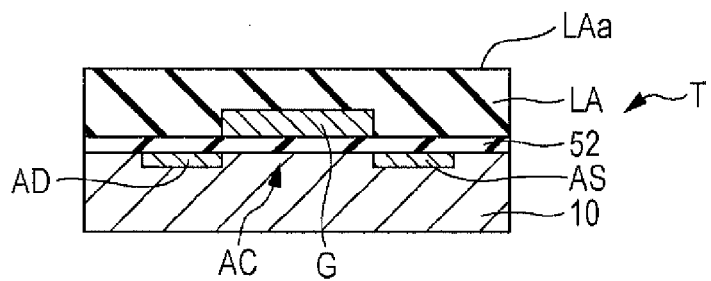
FIGS. 13A to 13E are sectional views showing a procedure of a method of forming a relay electrode in a first embodiment.

Firstly, as shown in FIG. 13A, the insulation layer LA which covers a gate electrode G is formed on the upper face of the gate electrode G side of the transistor T.

Figure 13B:
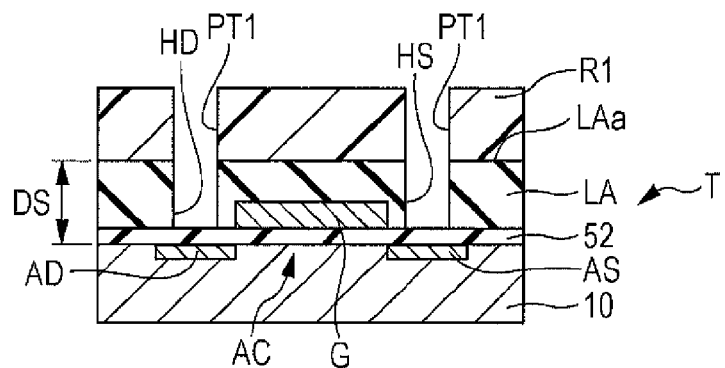

Next, as shown in FIG. 13B, a resist layer R1 on which a patterning PT1 is formed, is formed on an upper face LAa of the insulation layer LA. The patterning PT1 is formed by removing a resist at the position corresponding to the position of the contact hole formed on the drain region AD and the source region AS.

A method of forming the resist layer R1 is not particularly limited, and the resist layer R1 may be formed by exposing and developing to form the patterning PT1 after the resist is applied onto the upper face LAa of the insulation layer LA or the resist layer R1 in which the patterning PT1 is directly formed on the upper face LAa of the insulation layer LA using a screen printing method or the like, may be formed.

Next, the resist layer R1 is used as a mask and the insulation layer LA and the insulation film 52 are etched. A method of etching is not particularly limited and, for example, dry etching may be used or wet etching may be used.

Thereby, a contact hole HD penetrating the insulation layer LA and the insulation film 52 to the drain region AD in a lamination direction (in a vertical direction in the drawing) and a contact hole HS penetrating the insulation layer LA and the insulation film 52 to the source region AS in a lamination direction are formed. After the contact holes HD and HS are formed, the resist layer R1 is removed.

Figure 13C:
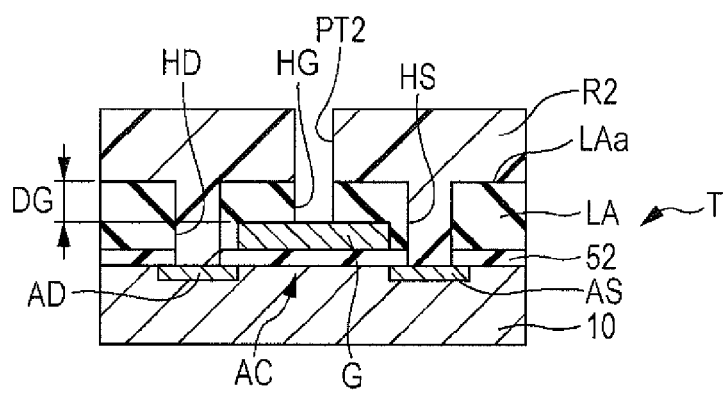

Next, as shown in FIG. 13C, a resist layer R2 on which a patterning PT2 is formed, is formed on the upper face LAa of the insulation layer LA. The patterning PT2 is formed by removing a resist at the position corresponding to the position of the contact hole formed on the gate electrode G. As a method of forming the resist layer R2, the same method can be selected as that of the resist layer R1 described above.

Next, the resist layer R2 is used as a mask and the insulation layer LA is etched. A method of etching is not particularly limited like the above and, for example, dry etching may be used or wet etching may be used.

Thereby, a contact hole HG penetrating the insulation film 52 to the gate electrode G in a lamination direction is formed. After the contact hole HG is formed, the resist layer R2 is removed.

Figure 13D:
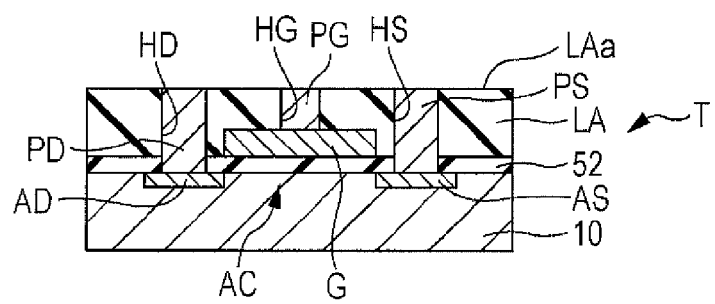

Next, as shown in FIG. 13D, a conductive material having low resistance and containing aluminum, silver or the like is adhered into the contact holes HG, HD, and HS. A method of adhering the conductive material is not particularly limited and, for example, a deposition method, a sputtering method, or the like can be selected.

Then, the surfaces of the conductive material and the insulation layer LA are polished and a plug PG electrically connected to the gate electrode G, a plug PD electrically connected to the drain region AD, and a plug PS electrically connected to the source region AS are formed.

Figure 13E:
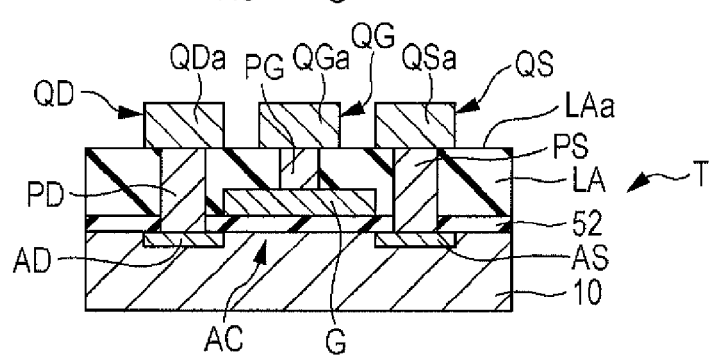

Next, as shown in FIG. 13E, a film is formed on the upper face LAa of the insulation layer LA using the conductive material and contact pads QGa, QDa, and QSa consisting of the same layer are formed.

A method of forming the contact pads QGa, QDa, and QSa is not particularly limited, and may be a method of patterning by etching after the conductive material is applied onto the upper face LAa of the insulation layer LA or may be a method of directly forming the contact pad on the upper face LAa of the insulation layer LA using a screen printing method or the like.

The contact pad QGa is electrically connected to the gate electrode G through the plug PG. The contact pad QDa is electrically connected to the drain region AD through the plug PD. The contact pad QSa is electrically connected to the source region AS through the plug PS.

By the above way, a relay electrode QG electrically connected to the gate electrode G, a relay electrode QD electrically connected to the drain region AD, and a relay electrode QS electrically connected to the source region AS are formed.

According the embodiment, since, in each transistor, the gate electrode is connected to each wiring at the position overlapping the channel region in plan view, it is possible to miniaturize the pixel circuit P11. Hereafter, description will be given in detail.

Figure 14A:
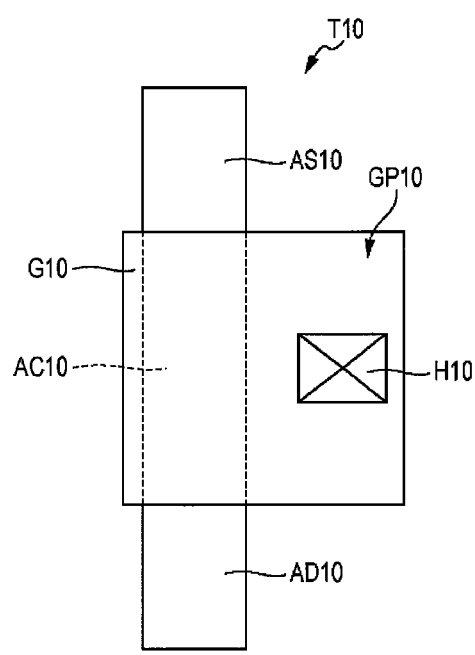
FIGS. 14A and 14B are explanatory views for explaining an effect of a first embodiment.

FIG. 14A is a plan view showing a transistor T10 of Comparative Example provided with a contact pad portion for a wiring connection in a gate electrode. As shown in FIG. 14A, the transistor T10 is provided with a gate electrode G10, a drain region AD10, and a source region AS10.

A contact pad portion GP10 projecting outward than the channel region AC10 is provided in the gate electrode G10. In such a transistor T10, a contact hole H10 for connecting to the wiring is provided on the contact pad portion GP10. In other words, the contact hole H10 is provided at the position not overlapping the channel region AC10 in plan view.

In the transistor T10, since the contact pad portion GP10 is provided, the size of the gate electrode G10 becomes larger in comparison with that of the channel region AC10, and as a result, there is a problem in which the width of the whole transistor became larger. Therefore, there is a limitation to miniaturize the pixel circuit which was configured by arranging a plurality of transistors.

Figure 14B:
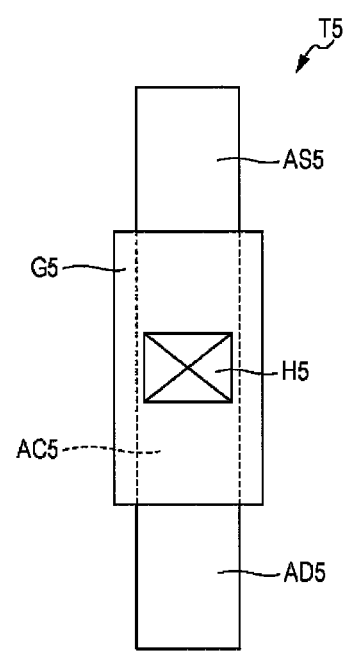

On the other hand, FIG. 14B is a plan view showing a transistor T5 of the embodiment. As shown in FIG. 14B, the transistor T5 is provided with a gate electrode G5, a drain region AD5, and a source region AS5.

In regard to the above-described problem, according to the transistor T5 of the embodiment, the gate electrode G5 is connected to the wiring at the position overlapping a channel region AC5 in plan view. In other words, a contact hole H5 connecting the gate electrode G5 with the wiring is provided at the position overlapping a channel region AC5 in plan view. Therefore, it is not necessary to provide the contact pad portion for a wiring connection in the gate electrode G5, and thus it is possible to make the size of the gate electrode G5 in plan view nearly the same size as the channel region AC5. Thereby, as shown in FIGS. 14A and 14E, in the transistor T5 of the embodiment, it is possible to reduce the length in a width direction (X direction) in comparison with the transistor T10 of Comparative Example. Therefore, according to the embodiment, it is possible to obtain the light emitting apparatus capable of further miniaturizing the pixel circuit.

Specifically, further description will be given of an effect of the embodiment with reference to FIG. 3.

According to the embodiment, it is possible to reduce a distance between the driving transistor TDR and the reset transistor T4, and the selecting transistor T1, the light emitting control transistor T2, and the compensation transistor T3 shown in FIG. 3, that is, a distance D1 between the virtual straight line K1 and the virtual straight line K2 in comparison with a case where the contact hole is provided at the position not overlapping the channel region in plan view. In addition, it is possible to form the signal line 26 and the third power source conductor 27 at the position which is closer to each transistor. Therefore, according to the embodiment, it is possible to further reduce the width (the length in an X direction) D2 of the pixel circuit P11 and it is possible to miniaturize the pixel circuit.

In addition, according to the embodiment, the compensation circuit for compensating a variation in supply current to the light emitting element 45 due to a variation in threshold voltage of the driving transistor TDR is incorporated in the pixel circuit P11. Therefore, it is possible to stably supply a current corresponding to the gradation level to the light emitting element 45. Thereby, even in a case where the threshold voltage of the driving transistor TDR varies, it is possible to suppress a variation in brightness of the light emitting element 45 by the contact in which the gate electrode and the wiring are connected being formed at the position overlapping the channel in plan view.

In addition, in the channel region of the transistor, the closer a region at a high potential side among the source region and the drain region is, the smaller an electric field generated by the gate electrode is. This is because that the voltage between the region at a high potential side and the gate electrode becomes higher than the voltage between the region at a low potential side and the gate electrode. Thereby, even a case where the contact hole is provided at the position overlapping the channel region in plan view, it is possible to reduce an influence on a variation in threshold voltage of the transistor by providing the contact hole connecting the gate electrode with the wiring closer to the region at a high potential side among the source region and the drain region, that is, at the position in which an effect of the electric field is small.

Figure 15A:
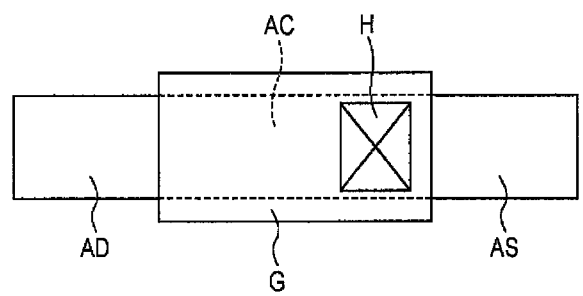
FIGS. 15A and 15B are explanatory views for explaining an arrangement position of a contact hole.
Figure 15B:
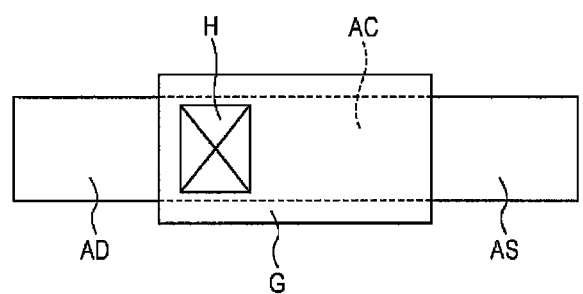

FIG. 15A is a plan view showing a setting position of a contact hole in a P channel type transistor. FIG. 15B is a plan view showing a setting position of a contact hole in an N channel type transistor.

As shown in FIG. 15A, in the P channel type transistor, in a case where a contact hole H is provided on the gate electrode G at the position overlapping the channel region AC in plan view, it is preferable that the contact hole H be provided closer to the source region AS. This is because the source region AS becomes a high potential side and the drain region AD becomes a low potential side since a carrier serves as a hole in the P channel type transistor.

On the other hand, as shown in FIG. 15S, in the N channel type transistor, in a case where the contact hole H is provided on the gate electrode G at the position overlapping the channel region AC in plan view, it is preferable that the contact hole H be provided closer to the drain region AD. This is because the drain region AD becomes a high potential side and the source region AS becomes a low potential side since a carrier serves as an electron in the N channel type transistor.

According to the embodiment, as shown in FIG. 3, a connecting position of the gate electrode with each wiring in the selecting transistor T1, the light emitting control transistor T2, the compensation transistor T3, and the reset transistor T4 is set closer to the source region on the gate electrode.

In the embodiment, since the transistor is the p channel type, it is possible to suppress a variation in threshold voltage of the transistor by providing the contact hole closer to the source region.

In addition, in the embodiment, as shown in FIGS. 13B and 13C, the depth DS from the upper face LAa of the insulation layer LA to the drain region AD and the source region AS is different from the depth DG from the upper face LAa of the insulation layer LA to the gate electrode G. Specifically, the depth DS from the upper face LAa of the insulation layer LA to the drain region AD and the source region AS is larger than the depth DG from the upper face LAa of the insulation layer LA to the gate electrode G. Therefore, if the contact holes HD and HS of the drain region AD and the source region AS and the contact hole HG of the gate electrode G are hypothetically etched once to be formed, there was a risk of causing damage to the gate electrode G.

In contrast, according to the embodiment, the contact holes of the drain region AD and the source region AS and the contact hole of the gate electrode G are formed in different processes. Therefore, it is possible to select an etching method corresponding to the depths of the contact holes formed respectively and it is possible to suppress causing damage to the gate electrode G.

In addition, according to the embodiment, since each wiring connected to the transistor is provided on the multilayer wiring layer laminated on the transistor, it is possible to arrange so that the wiring overlaps the transistor in plan view and thus it is possible to miniaturize the pixel circuit. In addition, thereby, according to the embodiment, the contact hole is easily formed at the position overlapping the channel region in plan view.

Moreover, in the embodiment, the following configuration can also be employed.

In the embodiment described above, all transistors included in the pixel circuit P11 are set to a configuration in which the gate electrode is connected to each wiring at the position overlapping the channel region in plan view, however, are not limited thereto.

Figure 16:
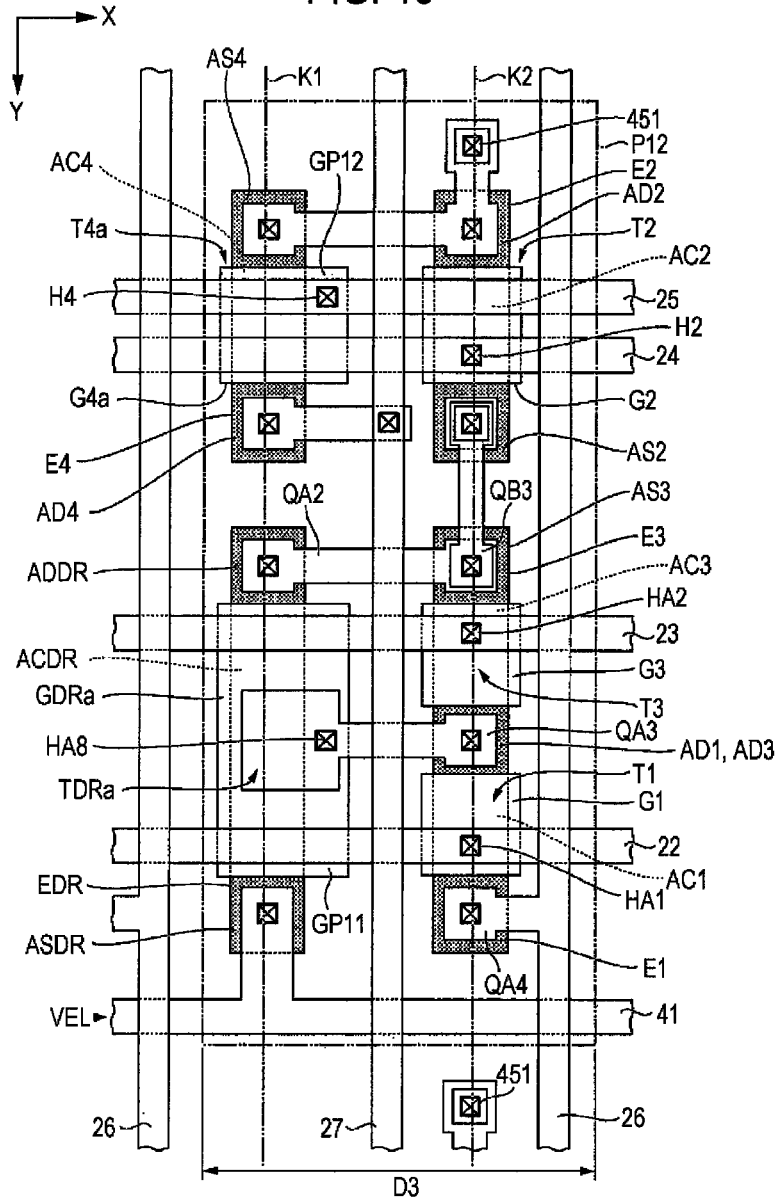
FIG. 16 is a plan view showing another example of a first embodiment.

In the embodiment, for example, like a pixel circuit P12 shown in FIG. 16, only some transistors may be set to a configuration in which the gate electrode is connected to each wiring at the position overlapping the channel region in plan view.

In the pixel circuit P12 shown in FIG. 16, the gate electrode is connected to the wiring at the position overlapping the channel region in plan view in the selecting transistor T1, the light emitting control transistor T2, and the compensation transistor T3. On the other hand, in a driving transistor TDRa, a contact pad portion GP11 is provided in a gate electrode GDRa and the contact hole HA8 is provided in the contact pad portion GP11. In a reset transistor T4a, a contact pad portion GP12 is provided in a gate electrode G4a and the contact hole H4 is provided on the contact pad portion GP12.

As in the embodiment, in a case where five transistors are arranged side by side in two lines, by connecting the gate electrode with the wiring at the position overlapping the channel region in plan view in the transistor provided in any one of lines, it is possible to reduce the width of line thereof, and thus it is possible to reduce the width D3 of the pixel circuit P12. In the embodiment, it is possible to reduce the width of line consisting of the selecting transistor T1, the light emitting control transistor T2, and the compensation transistor T3, that is, line of the transistor along the virtual straight line K2.

In addition, in the embodiment, the pixel circuit P12 may also be set to a configuration in which, in the driving transistor and the reset transistor, the gate electrode is connected to the wiring at the position overlapping the channel region in plan view and in the selecting transistor, the light emitting control transistor, and the compensation transistor, the gate electrode is connected to the wiring in the contact pad portion. In this case, it is possible to reduce the width of line consisting of the driving transistor and the reset transistor, that is, line of the transistor along the virtual straight line K1, and thus it is possible to reduce the width of the pixel circuit.

Second Embodiment

A second embodiment differs in not providing with the compensation transistor and the reset transistor in comparison with the first embodiment.

Moreover, as to the same configuration as the embodiment described above, there are some cases where description is omitted by appropriately attaching the same reference numerals or the like.

Figure 17:
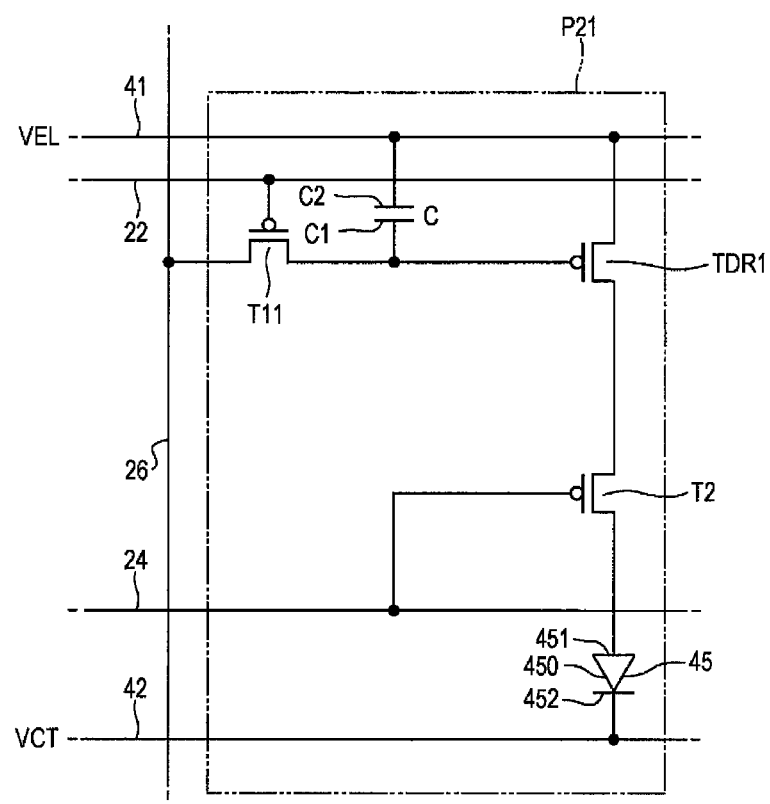
FIG. 17 is a circuit diagram showing a pixel circuit of a second embodiment.
Figure 18:
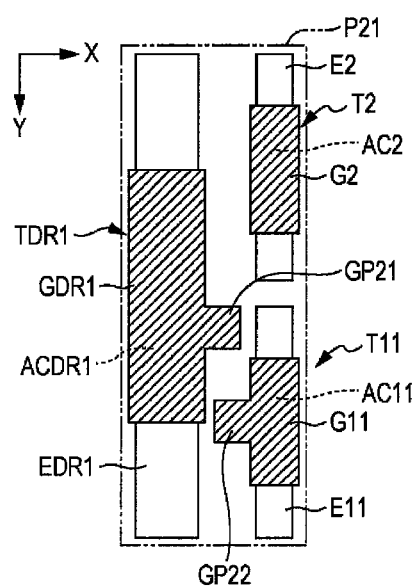
FIG. 18 is a plan view showing a pixel circuit of the second embodiment.
Figure 19:
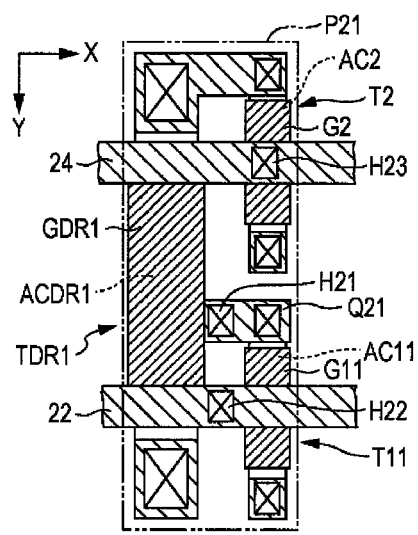
FIG. 19 is a plan view showing a pixel circuit of the second embodiment.

FIG. 17 is a circuit diagram showing a pixel circuit P21 of the embodiment. FIG. 18 and FIG. 19 are plan views schematically showing a pixel circuit P21 of the embodiment. In FIG. 18, an illustration of a wiring and a contact hole is omitted.

As shown in FIG. 17, the pixel circuit P21 of the embodiment is provided with a driving transistor (first transistor) TDR1, a selecting transistor T11, the light emitting control transistor T2, and the capacitive element C.

The driving transistor TDR1 and the selecting transistor T11 has the same functions as the driving transistor TDR and the selecting transistor T1 of the first embodiment.

In the driving transistor TDR1, the source thereof is connected to the first power source conductor 41, the drain thereof is connected to the source of the light emitting control transistor T2, and the gate thereof is connected to the drain of the selecting transistor and the first electrode C1 of the capacitive element C.

In the selecting transistor T11, the source thereof is connected to the signal line 26 and the drain thereof is connected to the gate of the driving transistor TDR1 and the first electrode C1 of the capacitive element C.

The light emitting control transistor T2 is provided between the driving transistor TDR1 and the light emitting element 45. In the light emitting control transistor T2, the source thereof is connected to the drain of the driving transistor TDR1 and the drain thereof is connected to the pixel electrode 451 of the light emitting element 45, and the gate thereof is connected to the control line 24.

In the embodiment, as shown in FIG. 18, each of the transistors TDR1, T11, and T2 is provided with element portions EDR1, E11, and E2 extending in a Y direction, and gate electrodes GDR1, G11, and G2. The element portion EDR1 of the driving transistor TDR1, the element portion E11 of the selecting transistor T11, and the element portion E2 of the light emitting control transistor T2 are respectively arranged so that the length direction becomes a Y direction.

The selecting transistor T11 and the light emitting control transistor T2 are provided side by side in a length direction (Y direction) at one side (+X side) of the driving transistor TDR1. That is, the driving transistor TDR1, the selecting transistor T11, and the light emitting control transistor T2 are arranged so as to be in two lines.

The gate electrode GDR1 of the driving transistor TDR1 has a contact pad portion GP21 projecting to the selecting transistor T11 side (+X side). The contact pad portion GP21 is provided at the position not overlapping a channel region ACDR1 of the driving transistor TDR1 in plan view.

The selecting transistor T11 has a contact pad portion GP22 projecting to the driving transistor TDR1 side (−X side). The contact pad portion GP22 is provided at the position not overlapping a channel region AC11 of the selecting transistor T11 in plan view.

As shown in FIG. 18 and FIG. 19, the gate electrode GDR1 of the driving transistor TDR1 is connected to a relay electrode (wiring) Q21 through a contact hole H21 in the contact pad portion GP21. The gate electrode G11 of the selecting transistor T11 is connected to the scanning line 22 through a contact hole H22 in the contact pad portion GP22. In the light emitting control transistor T2, the gate electrode G2 is connected to the control line 24 through a contact hole H23 at the position overlapping the channel region AC2 in plan view.

According to the embodiment, since, in the light emitting control transistor T2, the gate electrode G2 is connected to the control line 24 at the position overlapping the channel region AC2 in plan view, it is possible to further miniaturize the pixel circuit P21 in the same way as the first embodiment.

Moreover, in the embodiment, the pixel circuit P21 may be set to a configuration in which, in any one of or both of the driving transistor TDR1 and the selecting transistor T11, the gate electrode is connected to each wiring at the position overlapping the channel region in plan view.

Third Embodiment

The third embodiment differs in not providing with a rest transistor, with respect to the first embodiment.

Moreover, as to the same configuration as the embodiment described above, there are some cases where description will be omitted by appropriately attaching the same reference numerals.

Figure 20:
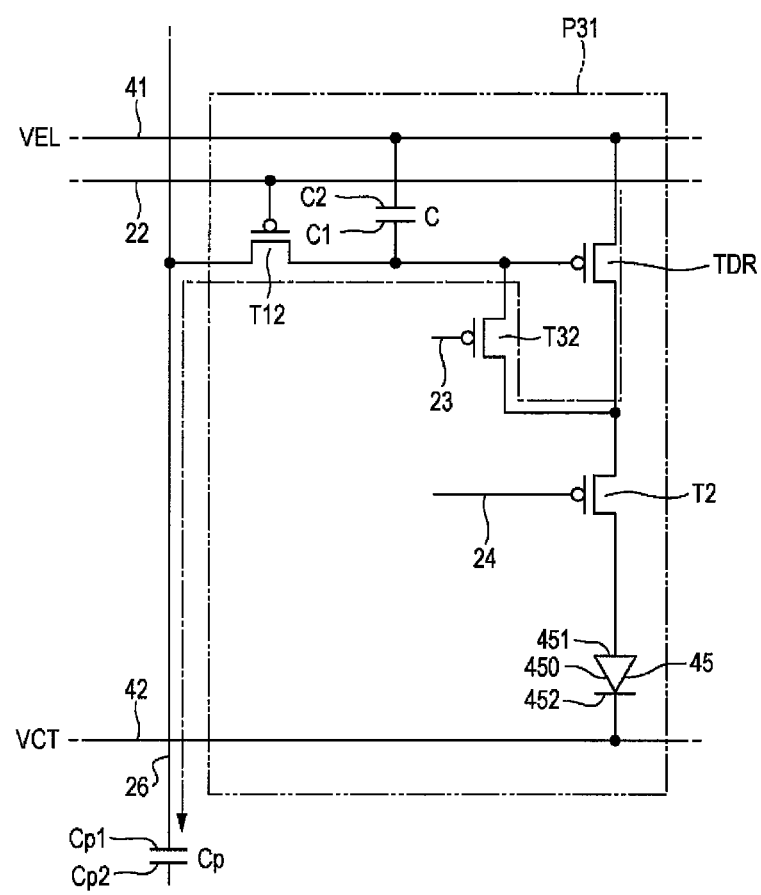
FIG. 20 is a circuit diagram showing a pixel circuit of a third embodiment.
Figure 21:
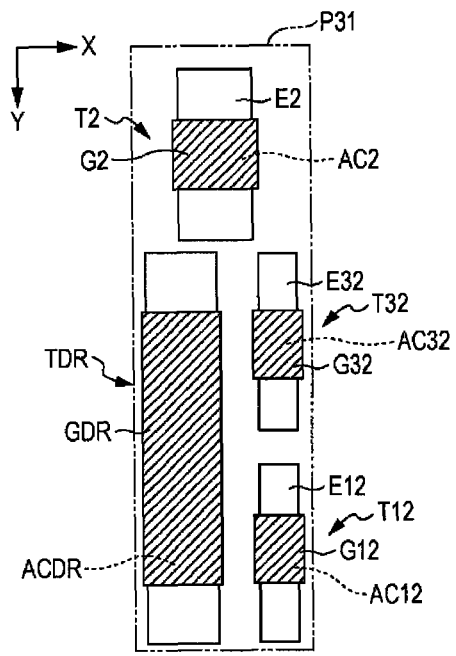
FIG. 21 is a plan view showing a pixel circuit of the third embodiment.
Figure 22:
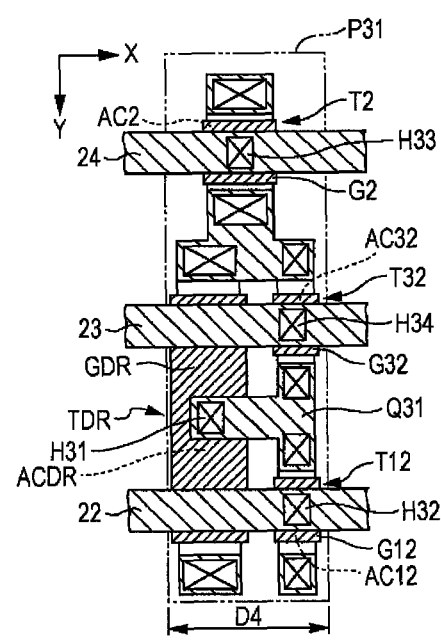
FIG. 22 is a plan view showing a pixel circuit of the third embodiment.

FIG. 20 is a circuit diagram showing a pixel circuit P31 of the embodiment. FIG. 21 and FIG. 22 are plan views schematically showing a pixel circuit P31 of the embodiment. In FIG. 21, an illustration of a wiring and a contact hole is omitted.

As shown in FIG. 20, the pixel circuit P31 of the embodiment is provided with the driving transistor TDR, a selecting transistor T12, the light emitting control transistor T2, a compensation transistor T32, and the capacitive element C.

The selecting transistor T12 and the compensation transistor T32 have the same functions as the selecting transistor T1 and the compensation transistor T3 of the first embodiment.

The connection of each transistor is the same as the circuit diagram shown in FIG. 2 in the first embodiment, except not providing with the rest transistor.

In the embodiment, as shown in FIG. 21, each of the transistors TDR, T12, T2, and T32 is provided with the element portions EDR, E12, E2, and E32 extending in a Y direction, and the gate electrodes GDR, G12, G2, and G32. The element portion EDR of the driving transistor TDR, the element portion E11 of the selecting transistor T12, the element portion E2 of the light emitting control transistor T2, and the element portion E32 of the compensation transistor T32 are respectively arranged so that the length direction becomes a Y direction.

The selecting transistor T12 and the compensation transistor T32 are arranged side by side at one side (+X side) of the driving transistor TDR in a length direction (Y direction).

That is, the driving transistor TDR1, the selecting transistor T11, and the light emitting control transistor T2 are arranged so as to be in two lines.

The light emitting control transistor T2 is provided at the upper side (−Y side) than the driving transistor TDR, the selecting transistor T12, and the compensation transistor T32 as shown in the drawing and is provided between the driving transistor TDR, the selecting transistor T12, and the compensation transistor T32 in a width direction (X direction).

As shown in FIG. 21 and FIG. 22, in the gate electrode GDR of the driving transistor TDR, the gate electrode GDR is connected to a relay electrode (wiring) Q31 through a contact hole H31 at the position overlapping the channel region ACDR in plan view. In the selecting transistor T12, the gate electrode G12 is connected to the scanning line 22 through a contact hole H32 at the position overlapping a channel region AC12 in plan view. In the light emitting control transistor T2, the gate electrode G2 is connected to the control line 24 through a contact hole H33 at the position overlapping the channel region AC2 in plan view. In the compensation transistor T32, the gate electrode G32 is connected to the control line 23 through a contact hole H34 at the position overlapping a channel region AC32 in plan view.

According to the embodiment, since, in each transistor, the gate electrode is connected to each wiring at the position overlapping the channel region in plan view, it is possible to further reduce the width D4 of the pixel circuit P31 in the same way as the first embodiment.

Moreover, in the embodiment, the pixel circuit P31 may be set to a configuration in which, in some of each transistor, the contact pad portion for a wiring connection is provided in the gate electrode. In other words, in the embodiment, the pixel circuit P31 may be set to a configuration in which, in some of each transistor, the gate electrode is connected to each wiring at the position not overlapping the channel region in plan view.

Electronic Device

The light emitting apparatus 100 exemplified in each embodiment described above is suitably used as a display apparatus of various kinds of electronic devices.

Figure 23:
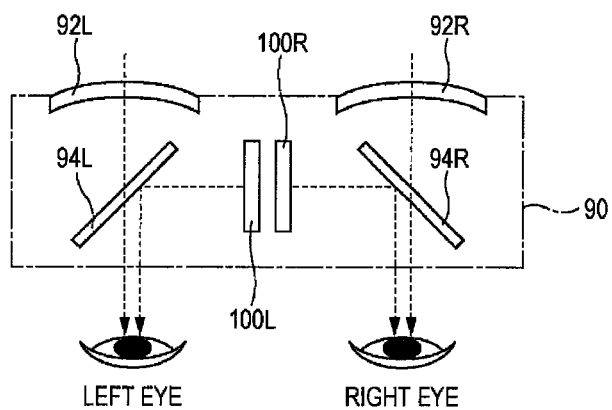
FIG. 23 is a view showing an example of an electronic device of the embodiment.

FIG. 23 is a schematic configuration view showing a head mounted type display apparatus 90 (head mounted display: HMD) using a light emitting apparatus 100 of the first embodiment as an example of an electronic device.

The display apparatus 90 is an electronic device capable of mounting to a human head and is provided with a transmitting portion (lens) 92L overlapping a left eye of a user, a transmitting portion 92R overlapping a right eye of a user, a light emitting apparatus 100L and a half mirror 94L for a left eye, and a light emitting apparatus 100R and a half mirror 94R for a right eye. The light emitting apparatus 100L and the light emitting apparatus 100S are arranged so that the injected light travels mutually in opposite directions. The half mirror 94L for a left eye allows the transmitted light in the transmitting portion 92L to transmit through a left eye side of a user and allows the injected light from the light emitting apparatus 100L to reflect toward a left eye side of a user. In the same way, the half mirror 94R for a right eye allows the transmitted light in the transmitting portion 92R to transmit through a right eye side of a user and allows the injected light from the light emitting apparatus 100R to reflect toward a right eye side of a user.

Therefore, a user perceives an image in which an image observed through the transmitting portion 92L and the transmitting portion 92R and a display image by each of the light emitting apparatuses 100L and 100R are superposed. In addition, it is possible to allow a user to perceive a stereoscopic effect of the display image by displaying a stereographic image (an image for a left eye and an image for a right eye) to which a parallax is mutually applied on the light emitting apparatus 100L and the light emitting apparatus 100R.

Moreover, the electronic device to which the light emitting apparatus in each embodiment is applied is not limited to the display apparatus 90 in FIG. 23. For example, the light emitting apparatus of the embodiment is also suitably used in an electronic view finder (EVF) used in an imaging apparatus such as a video camera or a still camera. In addition, the light emitting apparatus of the embodiment can be applied to various kinds of electronic devices such as a portable phone, a portable information terminal (smartphone), a monitor such as a television or a personal computer, or a car navigation apparatus.

In addition, in the example of the electronic device described above, the light emitting apparatus 100 of the first embodiment is used as a light emitting apparatus, however, the electronic device is not limited thereto and it is needless to say that any light emitting apparatus of the second embodiment and the third embodiment may be used.

In the transistor in the first embodiment to the third embodiment, the channel region is formed in the same region as the gate electrode and the transistor has the so-called self-alignment structure. However, the transistor may be configured so that a part of the source region or/and the drain region overlaps the gate electrode or there may be a space between the gate electrode and the source region or/and the drain region.

The transistor in the first embodiment to the third embodiment has the source region, the gate electrode, the drain region, and the channel region. The source region or/and the drain region may be configured of two kinds of impurity regions which are a low impurity concentration region and a high impurity concentration region. That is, the transistor in the first embodiment to the third embodiment may have a lightly doped drain (LDD) structure. Owing to an LDD structure, it is possible to suppress the occurrence of hot carrier. Furthermore, the transistor may be configured so that a low impurity concentration region overlaps the gate electrode in plan view.

Here, in at least one of a plurality of transistors, the gate electrode may be connected to the wiring at the position overlapping at least a part of the source region or/and the drain region in plan view.

The pixel circuit P11 of the first embodiment or the pixel circuit P31 of the third embodiment may be operated as a method of driving shown in FIG. 13A to FIG. 17 and an illustration thereof in JP-A-2013-088611 or can be appropriately modified.

In addition, the pixel circuit P11 of the first embodiment or the pixel circuit P31 of the third embodiment may be driven by the so-called current program system. In this case, the capacitive element Cp which is connected to the signal line 26 is omitted. A current corresponding to the voltage between the source and the gate of the driving transistor TDR may be supplied from the driving transistor TDR to the light emitting element 45, by turning the selecting transistor T12 and the compensation transistor T32 in FIG. 20 to an ON state, turning the light emitting control transistor T2 to an OFF state, flowing a signal current corresponding to the gradation level to the signal line 26, conducting the programming after the voltage between the source and the gate of the driving transistor TDR is set to the voltage corresponding to the signal current, turning the selecting transistor T12 and the compensation transistor T32 in FIG. 20 to an OFF state, and turning the light emitting control transistor T2 to an ON state.

In addition, the pixel circuit P21 in FIG. 17 may be operated as a method of driving shown in FIG. 4 to FIG. 10 and an illustration thereof in JP-A-2013-088611.

In addition, specific description of a constituent material, a shape, an arrangement, a size, a film thickness, or the like of various kinds of electrodes, wirings, transistors, capacitive elements, insulation films, or the like in the light emitting apparatus from the first embodiment to the third embodiment described above is only one example and the light emitting apparatus from the first embodiment to the third embodiment can be appropriately changed.

The entire disclosure of Japanese Patent Application No.: 2014-009767, filed Jan. 22, 2014 is expressly incorporated by reference herein.

What is claimed is:

1. A light emitting apparatus comprising:
a pixel circuit which is provided with a plurality of transistors including a first transistor and a light emitting element in which a current is supplied by the first transistor,
wherein, in at least one of the plurality of transistors, a wiring is connected to a gate electrode at a position overlapping a channel region in plan view, the gate electrode and the channel region having an approximately same area in plan view.

2. The light emitting apparatus according to claim 1,
wherein the plurality of transistors include a selecting transistor provided between a gate of the first transistor and a signal line for inputting a signal into a gate of the first transistor, and
wherein, in the selecting transistor, a wiring is connected to a gate electrode at a position overlapping a channel region in plan view.

3. The light emitting apparatus according to claim 1,
wherein the plurality of transistors include a compensation transistor provided between a gate of the first transistor and one current terminal of the first transistor, and
wherein in the compensation transistor, a wiring is connected to a gate electrode at a position overlapping a channel region in plan view.

4. The light emitting apparatus according to claim 1,
wherein the plurality of transistors include a light emitting control transistor provided between the first transistor and the light emitting element, and
wherein, in the light emitting control transistor, a wiring is connected to a gate electrode at a position overlapping a channel region in plan view.

5. The light emitting apparatus according to claim 1,
wherein the plurality of transistors include a reset transistor for feeding a predetermined reset potential in the light emitting element, and
wherein in the reset transistor, a wiring is connected to a gate electrode at a position overlapping a channel region in plan view.

6. The light emitting apparatus according to claim 1,
wherein, in the first transistor, a wiring is connected to a gate electrode at a position overlapping a channel region in plan view.

7. The light emitting apparatus according to claim 6,
wherein the pixel circuit has a characteristic compensation circuit.

8. The light emitting apparatus according to claim 1,
wherein the wiring is provided on a different layer from that on which the plurality of transistors are provided.

9. The light emitting apparatus according to claim 8,
wherein the wiring overlaps at least two of the plurality of transistors in plan view.

10. A light emitting apparatus comprising:
a pixel circuit which is provided with a plurality of transistors including a first transistor, a light emitting element in which a current is supplied by the first transistor, and a second transistor provided between the first transistor and the light emitting element, and
wherein, in the second transistor, a wiring is connected to a gate electrode at a position overlapping a channel region in plan view, the gate electrode and the channel region having an approximately same area in plan view.

11. The light emitting apparatus according to claim 1, wherein a position at which the wiring in the gate electrode is connected is closer to a current terminal of the side which becomes a high potential of a pair of current terminals with the gate electrode therebetween.

12. The light emitting apparatus according to claim 1, wherein the light emitting element is an organic electroluminescence element.

13. An electronic device comprising:
the light emitting apparatus according to claim 1.
14. An electronic device comprising:
the light emitting apparatus according to claim 2.
15. An electronic device comprising:
the light emitting apparatus according to claim 3.
16. An electronic device comprising:
the light emitting apparatus according to claim 4.
17. An electronic device comprising:
the light emitting apparatus according to claim 5.
18. An electronic device comprising:
the light emitting apparatus according to claim 6.
19. An electronic device comprising:
the light emitting apparatus according to claim 7.
20. An electronic device comprising:
the light emitting apparatus according to claim 8.

* * * * *